(12) United States Patent
Ota et al.

(10) Patent No.: US 12,335,650 B2
(45) Date of Patent: Jun. 17, 2025

(54) IMAGING DEVICE

(71) Applicant: Panasonic Intellectual Property Management Co., Ltd., Osaka (JP)

(72) Inventors: Sogo Ota, Osaka (JP); Junji Hirase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 139 days.

(21) Appl. No.: 18/302,863

(22) Filed: Apr. 19, 2023

(65) Prior Publication Data

US 2023/0262364 A1 Aug. 17, 2023

Related U.S. Application Data

(63) Continuation of application No. PCT/JP2021/040530, filed on Nov. 4, 2021.

(30) Foreign Application Priority Data

Nov. 13, 2020 (JP) .................................. 2020-189549

(51) Int. Cl.
*H04N 25/78* (2023.01)
*H04N 25/59* (2023.01)
*H04N 25/771* (2023.01)
*H10F 39/12* (2025.01)
*H10K 39/00* (2023.01)

(52) U.S. Cl.
CPC .......... *H04N 25/78* (2023.01); *H04N 25/771* (2023.01)

(58) Field of Classification Search
CPC ...... H04N 25/78; H04N 25/771; H04N 25/59; H01L 27/146; H01L 27/14665; H01L 27/14643; H01L 29/42372; H10K 39/00; H10F 39/12
See application file for complete search history.

(56) References Cited

U.S. PATENT DOCUMENTS

| 10,212,372 B2 * | 2/2019 | Sato ...................... H10F 39/812 |
| 10,681,291 B2 * | 6/2020 | Shimasaki ........... H04N 25/778 |
| 12,022,215 B2 * | 6/2024 | Nishimura ............ H10F 39/811 |

(Continued)

FOREIGN PATENT DOCUMENTS

| JP | 2005-328493 | 11/2005 |
| JP | 2006-253876 | 9/2006 |

(Continued)

OTHER PUBLICATIONS

International Search Report of PCT application No. PCT/JP2021/040530 dated Jan. 25, 2022.

*Primary Examiner* — Marly S Camargo
(74) *Attorney, Agent, or Firm* — Rimon P.C.

(57) ABSTRACT

An imaging device includes a first photoelectric converter that converts light into a charge, a first charge storage that stores the charge, a first capacitor, an output circuit electrically connected to the first capacitor, and a first interposing transistor including a gate electrode, a source, and a drain. A potential of the first charge storage, a potential of the gate electrode, and a potential of one of the source and the drain are continuously the same during a control cycle period. By turning on the first interposing transistor, the first charge storage and the first capacitor are electrically connected.

20 Claims, 21 Drawing Sheets

(56) References Cited

U.S. PATENT DOCUMENTS

| | | | |
|---|---|---|---|
| 2008/0266434 A1 | 10/2008 | Sugawa et al. | |
| 2018/0083004 A1* | 3/2018 | Sato et al. | H10D 84/856 |
| 2018/0205896 A1 | 7/2018 | Nishimura et al. | |
| 2018/0241955 A1 | 8/2018 | Sakano et al. | |
| 2023/0336886 A1* | 10/2023 | Murakami | H04N 25/76 |
| 2024/0107201 A1* | 3/2024 | Zeituni | H04N 25/57 |

FOREIGN PATENT DOCUMENTS

| | | |
|---|---|---|
| JP | 2018-117347 | 7/2018 |
| WO | 2016/147885 | 9/2016 |

* cited by examiner

IMAGING DEVICE

BACKGROUND

1. Technical Field

The present disclosure relates to an imaging device.

2. Description of the Related Art

A variety of imaging devices have been proposed in the past. For example, Japanese Laid-open Patent Publication No. 2006-253876 and Japanese Patent No. 4317115 disclose imaging devices in which a photodiode is used as a photoelectric converter. International Publication Pamphlet No. WO 2016/147885 discloses an imaging device in which two photodiodes are provided inside a single pixel.

A structure in which a photoelectric converter having a photoelectric conversion layer is disposed on top of a semiconductor substrate may also be adopted. An imaging device having such a structure is referred to as a multilayer imaging device. Japanese Laid-open Patent Publication No. 2018-117347 discloses an example of a multilayer imaging device. Specifically, in Japanese Laid-open Patent Publication No. 2018-117347, two photoelectric converters having a photoelectric conversion layer are provided inside a single pixel.

SUMMARY

In one general aspect, the techniques disclosed here feature an imaging device including a first photoelectric converter that converts light into a charge, a first charge storage that stores the charge, a first capacitor, an output circuit electrically connected to the first capacitor, and a first interposing transistor including a gate electrode, a source, and a drain. A potential of the first charge storage, a potential of the gate electrode, and a potential of one of the source and the drain are continuously the same during a control cycle period. By turning on the first interposing transistor, the first charge storage and the first capacitor are electrically connected.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
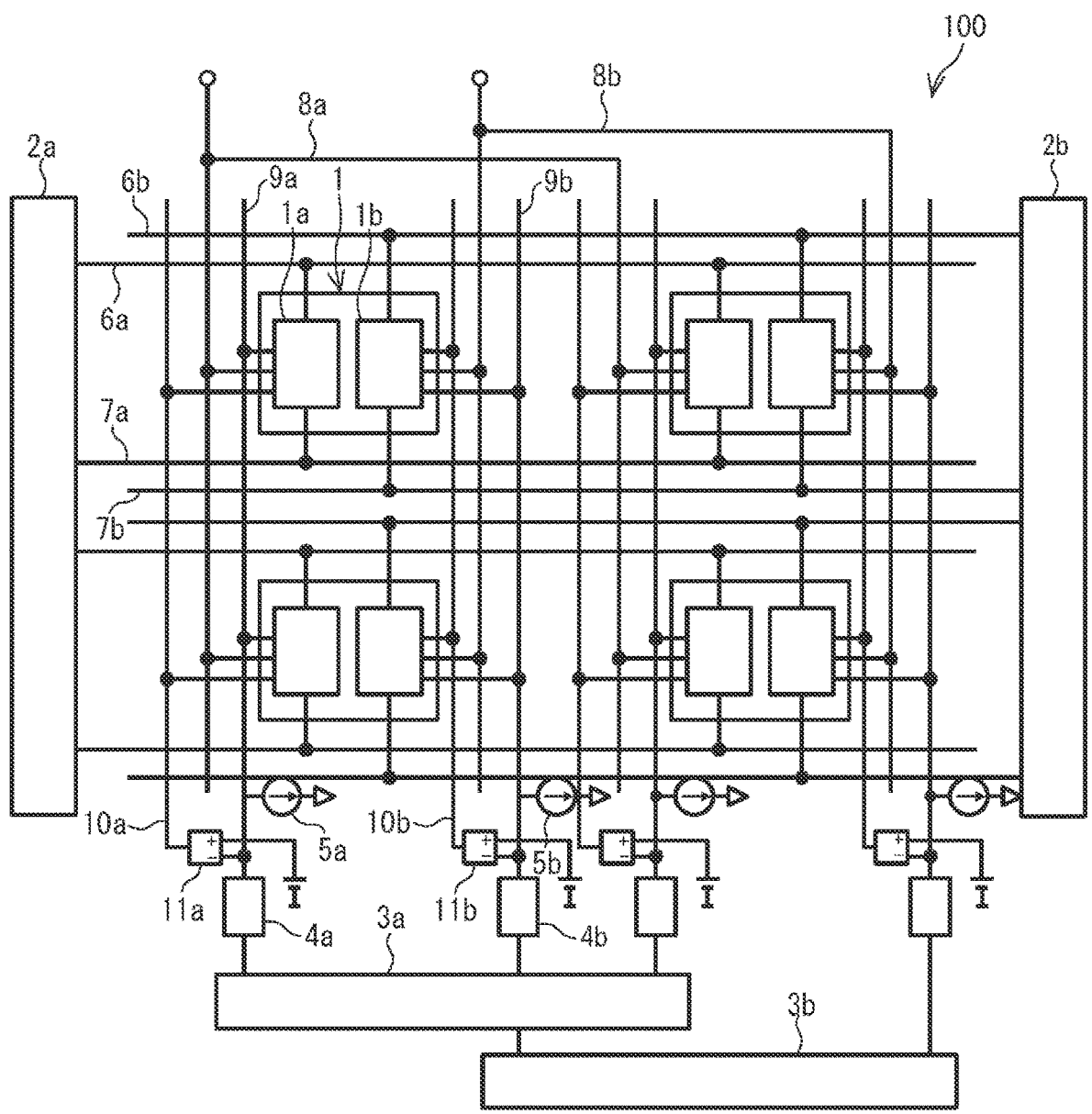
FIG. 1 is a block diagram schematically illustrating an example of the structure of an imaging device.

Overview of Aspects According to Present Disclosure

An imaging device according to a first aspect of the present disclosure includes:

a first photoelectric converter that converts light into a charge;

a first charge storage that stores the charge;

a first capacitor;

an output circuit electrically connected to the first capacitor; and a first interposing transistor including a gate electrode, a source, and a drain. A potential of the first charge storage, a potential of the gate electrode, and a potential of one of the source and the drain are continuously the same during a control cycle period. By turning on the first interposing transistor, the first charge storage and the first capacitor are electrically connected.

The technology according to the first aspect is suitable for mitigating a decrease in the SNR associated with a decrease in the intensity of light.

An imaging device according to a second aspect of the present disclosure includes:

a first photoelectric converter that converts light into a charge;

a first charge storage that stores the charge;

a first capacitor;

an output circuit electrically connected to the first capacitor; and a first interposing transistor including a gate electrode, a source, and a drain. A potential of the first charge storage, a potential of the gate electrode, and a potential of one of the source and the drain are continuously the same during a control cycle period. The other of the source and the drain is electrically connected to the first capacitor.

The technology according to the second aspect is suitable for mitigating a decrease in the SNR associated with a decrease in the intensity of light.

In a third aspect of the present disclosure, for example, the imaging device according to the first or second aspect may additionally include a first following transistor, and by turning on the first following transistor, the output circuit may be electrically connected to the first capacitor.

According to the first following transistor of the third aspect, it is possible to toggle whether the first capacitor and the connection thereof are electrically connected via the first following transistor.

In a fourth aspect of the present disclosure, for example, in the imaging device according to any one of the first to third aspects, the first photoelectric converter may include a first electrode, a second electrode, and a photoelectric conversion layer disposed between the first electrode and the second electrode.

The first photoelectric converter of the fourth aspect is an example of a first photoelectric converter.

In a fifth aspect of the present disclosure, for example, in the imaging device according to any one of the first to third aspects, the first photoelectric converter may be a photodiode.

The first photoelectric converter of the fifth aspect is an example of a first photoelectric converter.

In a sixth aspect of the present disclosure, for example, in the imaging device according to any one of the first to fifth aspects, the first capacitor may have a metal-insulator-metal structure.

The first capacitor of the sixth aspect may be a high-density capacitor.

In a seventh aspect of the present disclosure, for example, in the imaging device according to any one of the first to sixth aspects, by turning on the first interposing transistor, the first charge storage may be electrically connected to one end of the first capacitor, and a direct-current potential may be applied to the other end of the first capacitor.

The way of using the first capacitor in the seventh aspect is an example of a way of using a capacitor.

In an eighth aspect of the present disclosure, for example, in the imaging device according to any one of the first to seventh aspects, the imaging device may be configured to take a first state and a second state, the first state may be a state in which the first charge storage and the first capacitor are electrically connected through the first interposing transistor, and the second state may be a state in which a capacitor electrically connected to the first charge storage is not present.

The technology according to the eighth aspect is suitable for mitigating a decrease in the SNR associated with a decrease in the intensity of light.

In a ninth aspect of the present disclosure, for example, in the imaging device according to any one of the first to eighth aspects, the conductivity type of the gate electrode of the first interposing transistor may be the opposite of the conductivity type of the source and the drain of the first interposing transistor.

According to the ninth aspect, dark current is easily suppressed.

In a 10th aspect of the present disclosure, for example, in the imaging device according to any one of the first to ninth aspects, the imaging device may be configured such that a signal corresponding to the potential of the first charge storage is read out after a signal corresponding to the potential of the first capacitor is read out.

The way of reading out a signal in the 10th aspect is an example of a way of reading out a signal.

In an 11th aspect of the present disclosure, for example, the imaging device according to any one of the first to 10th aspects may further include an additional capacitor and an additional interposing transistor including a gate electrode, a source, and a drain, the gate electrode of the additional interposing transistor and one of the source and the drain of the additional interposing transistor may be electrically connected to the first capacitor, and by turning on the additional interposing transistor, the first capacitor and the additional capacitor may be electrically connected.

According to the 11th aspect, it is possible to expand the intensity region where the SNR is high.

In a 12th aspect of the present disclosure, for example, the imaging device according to any one of the first to 11th aspects may further include a first following transistor including a gate electrode, a source, and a drain and a first amplification transistor including a gate electrode, a source, and a drain, the first charge storage may be electrically connected to the gate electrode of the first amplification transistor, and by turning on the first following transistor, the first capacitor, one of the source and the drain of the first following transistor, the other of the source and the drain of the first following transistor, and the gate electrode of the first amplification transistor may be electrically connected in the above order.

The configuration of the imaging device according to the 12th aspect is simple.

In a 13th aspect of the present disclosure, for example, the imaging device according to any one of the first to 11th aspects may further include a first amplification transistor including a gate electrode, a source, and a drain and an additional amplification transistor including a gate electrode, a source, and a drain, the first charge storage may be electrically connected to the gate electrode of the first amplification transistor, and the first capacitor may be electrically connected to the gate electrode of the additional amplification transistor.

According to the 13th aspect, a wide dynamic range is easily achieved.

In a 14th aspect of the present disclosure, for example, the imaging device according to the 12th or 13th aspect may further include a first imaging cell and a second imaging cell including a second photoelectric converter and a second charge storage, the first imaging cell and the second imaging cell may be included inside a single pixel included in the imaging device, the first imaging cell may include the first photoelectric converter and the first charge storage, and the second charge storage may store a charge generated by the second photoelectric converter.

According to the 14th aspect, the characteristics of the imaging device are easily adjusted.

In a 15th aspect of the present disclosure, for example, the imaging device according to any one of the first to 11th aspects may further include a first imaging cell and a second imaging cell including a second photoelectric converter and a second charge storage, the first imaging cell and the second imaging cell may be included inside a single pixel included in the imaging device, the first imaging cell may include the first photoelectric converter and the first charge storage, and the second charge storage may store a charge generated by the second photoelectric converter.

According to the 15th aspect, the characteristics of the imaging device are easily adjusted.

In a 16th aspect of the present disclosure, for example, the imaging device according to the 15th aspect may further include a first following transistor including a gate electrode, a source, and a drain, the first imaging cell may further include a first amplification transistor including a gate electrode, a source, and a drain, the second imaging cell may further include a second amplification transistor including a gate electrode, a source, and a drain, the first charge storage may be electrically connected to the gate electrode of the first amplification transistor, the second charge storage may be electrically connected to the gate electrode of the second amplification transistor, and by turning on the first following transistor, the first capacitor, one of the source and the drain of the first following transistor, the other of the source and the drain of the first following transistor, and the gate electrode of the second amplification transistor may be electrically connected in the above order.

According to the 16th aspect, the second amplification transistor of the second imaging cell can be used to read out a signal corresponding to the potential of the first capacitor.

In a 17th aspect of the present disclosure, for example, the imaging device according to the 15th aspect may further include a first following transistor including a gate electrode, a source, and a drain, the first imaging cell may further include a first amplification transistor including a gate electrode, a source, and a drain, the second imaging cell may further include a specific capacitor, the first capacitor may be electrically connected to the specific capacitor, the first charge storage may be electrically connected to the gate electrode of the first amplification transistor, and by turning on the first following transistor, the first capacitor, one of the source and the drain of the first following transistor, the other of the source and the drain of the first following transistor, and the gate electrode of the first amplification transistor may be electrically connected in the above order.

According to the 17th aspect, misalignment is easily suppressed while causing not only the first capacitor but also the specific capacitor to contribute to a wide dynamic range.

In an 18th aspect of the present disclosure, for example, in the imaging device according to any one of the 14th to 17th aspects, the second imaging cell may further include a second capacitor and a second interposing transistor including a gate electrode, a source, and a drain, the gate electrode of the second interposing transistor and one of the source and the drain of the second interposing transistor may be electrically connected to the second charge storage, and by turning on the second interposing transistor, the second charge storage and the second capacitor may be electrically connected.

According to the 18th aspect, it is possible to expand the intensity region where the SNR is high.

In a 19th aspect of the present disclosure, for example, in the imaging device according to any one of the 14th to 18th aspects, the first imaging cell may include a first microlens, the second imaging cell may include a second microlens, and in a planar view, the area of the second microlens may be larger than the area of the first microlens.

According to the 19th aspect, the sensitivity of the second imaging cell is easily raised higher than the sensitivity of the first imaging cell.

In a 20th aspect of the present disclosure, for example, in the imaging device according to any one of the 14th to 19th aspects, the sensitivity of the second imaging cell may be higher than the sensitivity of the first imaging cell.

According to the 20th aspect, a wide dynamic range is easily achieved.

In the embodiments, terms such as "above" and "below" are merely used to specify the arrangement of members relative to each other, and are not intended to limit the attitude or orientation when the imaging device is used.

In the embodiments, the imaging device may have a flat shape. Specifically, the imaging device may be a flat chip. In a first definition, a "planar view" refers to a view as seen from the thickness direction of the imaging device. In a second definition, a "planar view" refers to a view as seen from the thickness direction of a gate electrode of a first interposing transistor. In a third definition, a "planar view" refers to a view as seen from the thickness direction of a semiconductor substrate. In the embodiments, a view is treated as a "planar view" if the view may be considered a "planar view" on the basis of at least one of the first, second, and third definitions.

In the following embodiments, each element may be adjusted, as appropriate, according to whether the signal charge is positive or negative, such as by changing the conductivity type of the impurity region. Moreover, the wording of terms may be changed, as appropriate, according to whether the signal charge is positive or negative.

An imaging device according to an aspect of the present disclosure is used for an in-vehicle camera for sensing, for example. For instance, by causing a first imaging cell and a second imaging cell to operate at mutually different frame rates, the acquisition of high-speed sensing data is possible.

Hereinafter, embodiments of the present disclosure will be described in detail and with reference to the drawings. Note that the embodiments described hereinafter all illustrate general or specific examples. Features such as numerical values, shapes, materials, structural elements, arrangements and connection states of structural elements, steps, and the ordering of steps indicated in the following embodiments are merely examples, and are not intended to limit the present disclosure. The various aspects described in this specification may also be combined with each other in non-contradictory ways. In addition, among the structural elements in the following embodiments, structural elements that are not described in the independent claim indicating the broadest concept are described as arbitrary or optional structural elements. In the following description, structural elements having substantially the same functions will be denoted by shared reference signs, and the description of such structural elements may be reduced or omitted.

First Embodiment

Figure 2:
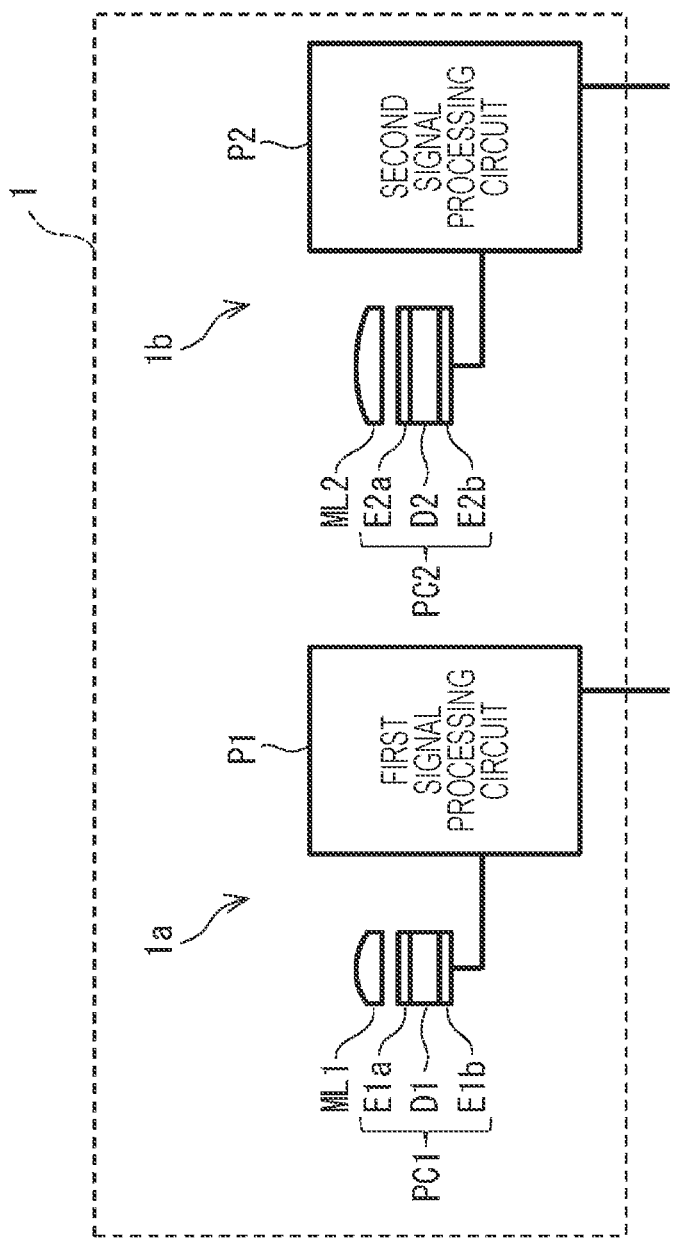
FIG. 2 is a schematic diagram illustrating a first signal processing circuit and a second signal processing circuit.
Figure 3:
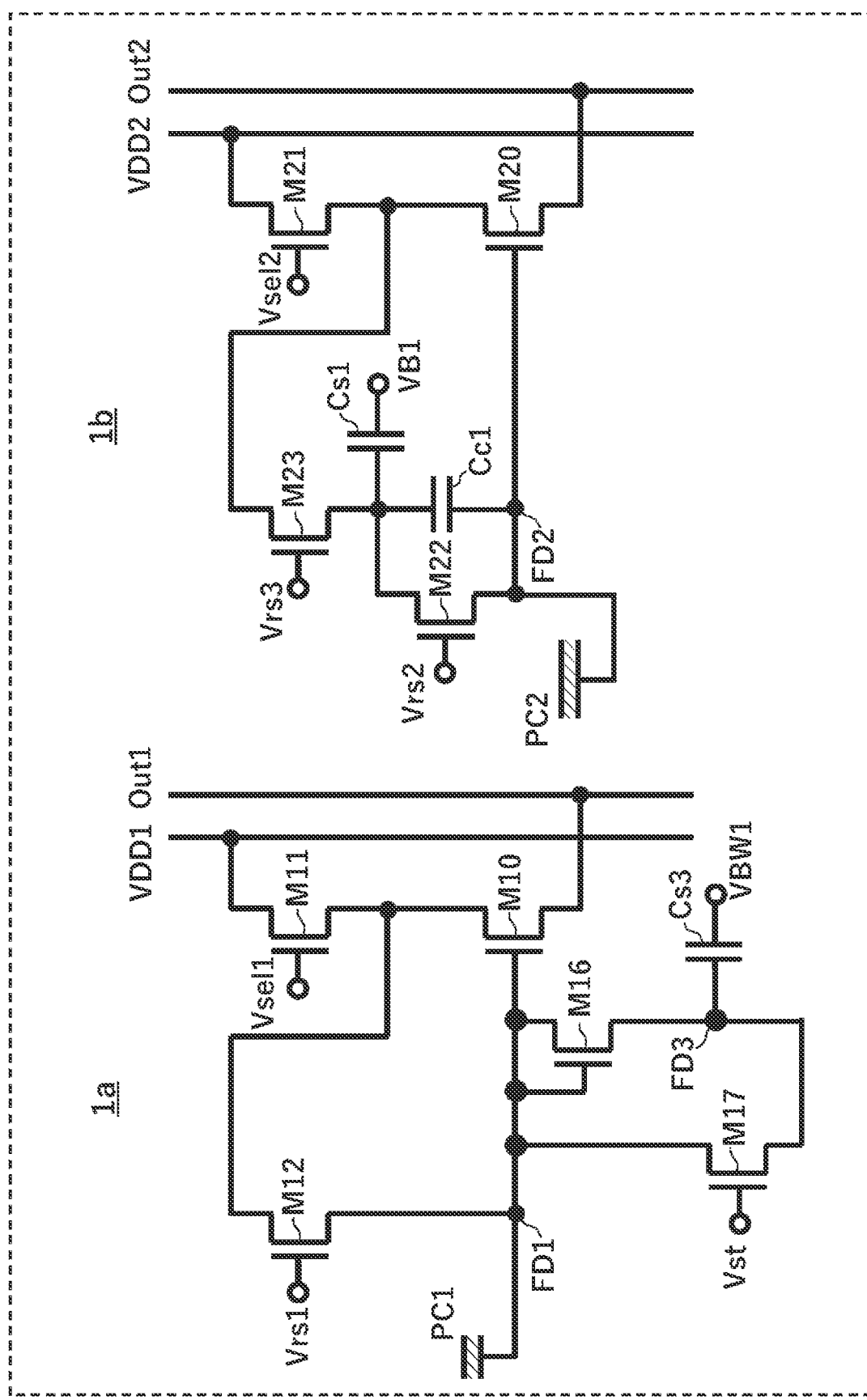
FIG. 3 is a schematic diagram illustrating an example of a circuit configuration of a pixel according to a first embodiment.

The structure of an imaging device 100 according to the present embodiment will be described with reference to FIGS. 1 to 3. FIG. 1 is a block diagram schematically illustrating an example of the structure of the imaging device 100. FIG. 2 is a schematic diagram illustrating a first signal processing circuit P1 and a second signal processing circuit P2 according to the present embodiment. FIG. 3 is a schematic diagram illustrating an example of a circuit configuration of a pixel 1 according to the present embodiment. The pixel 1 may also be referred to as a unit pixel.

In the following example, a p-type silicon substrate is used as a semiconductor substrate. A positive charge is used as the signal charge. Specifically, positive holes are used as the signal charge. Also, transistors M10, M11, M12, M16, M17, M20, M21, M22, and M23 are n-type transistors. Specifically, the transistors are n-type metal-oxide-semiconductor field-effect transistors (MOSFETs).

However, a negative charge may also be used as the signal charge. Specifically, electrons may be used as the signal charge. In this case, p-type transistors can be used as the transistors M10, M11, M12, M16, M17, M20, M21, M22, and M23. Specifically, in this case, p-type MOSFETs can be used as the transistors.

Structure of Imaging Device 100

As illustrated in FIG. 1, the imaging device 100 is provided with multiple pixels 1. The pixels 1 are arrayed two-dimensionally. In actuality, several million pixels 1 are arrayed two-dimensionally. FIG. 1 illustrates four such pixels 1. The four pixels 1 are arranged in a 2×2 array of rows and columns.

The imaging device 100 may also be a line sensor. In this case, the pixels 1 may be arrayed one-dimensionally. Specifically, in this case, the pixels 1 may be arrayed in the row direction or the column direction.

In the imaging device 100, a first imaging cell 1a and a second imaging cell 1b are included inside a single pixel 1.

As illustrated in FIGS. 2 and 3, the first imaging cell 1a is provided with a first microlens ML1, a first photoelectric converter PC1, and a first charge storage FD1. The first microlens ML1 and the first photoelectric converter PC1 are provided on top of a semiconductor substrate not illustrated. The first charge storage FD1 is a diffusion region provided inside the semiconductor substrate.

Light is incident on the first photoelectric converter PC1 through the first microlens ML1. The first photoelectric converter PC1 converts the light into a charge. The first charge storage FD1 stores the charge. As the charge is progressively stored in the first charge storage FD1, the potential of the first charge storage FD1 rises.

In the present embodiment, the first photoelectric converter PC1 includes a pair of electrodes E1a and E1b and a first photoelectric conversion layer D1. The first photoelectric conversion layer D1 is disposed between the pair of electrodes E1a and E1b. One of the pair of electrodes E1a and E1b is a first upper electrode E1a corresponding to a first electrode. The other of the pair of electrodes E1a and E1b is a first pixel electrode E1b corresponding to a second electrode. The first upper electrode E1a faces the first pixel electrode E1b. The first upper electrode E1a may also be referred to as a first counter electrode.

A voltage may be applied to the first upper electrode E1a. With this arrangement, a potential difference occurs between the pair of electrodes E1a and E1b. Consequently, an electric field is applied to the first photoelectric conversion layer D1. With this arrangement, a signal charge produced by photoelectric conversion in the first photoelectric conversion layer D1 is guided to the first pixel electrode E1b. Thereafter, the signal charge is transferred from the first pixel electrode E1b to the first charge storage FD1 and stored in the first charge storage FD1.

In the present embodiment, the first photoelectric conversion layer D1 is a photoelectric conversion film. Specifically, the first photoelectric conversion layer D1 is an organic film. However, the first photoelectric conversion layer D1 may also be an inorganic film.

In the present embodiment, the first upper electrode E1a is a transparent electrode. The transparent electrode is an indium tin oxide (ITO) film, for example.

The first photoelectric converter PC1 may be a photodiode. The first photoelectric converter PC1 which is a photodiode may be provided inside the semiconductor substrate. An aspect in which the first photoelectric converter PC1 is a photodiode is described in detail in the ninth embodiment.

The first imaging cell 1a may also have a first light shield that blocks the incidence of light on the first photoelectric converter PC1. The first imaging cell 1a may also have a first waveguide that guides light to the first photoelectric converter PC1.

The second imaging cell 1b is provided with a second microlens ML2, a second photoelectric converter PC2, and a second charge storage FD2. The second microlens ML2 and the second photoelectric converter PC2 are provided on top of a semiconductor substrate not illustrated. The second charge storage FD2 is a diffusion region provided inside the semiconductor substrate.

Light is incident on the second photoelectric converter PC2 through the second microlens ML2. The second photoelectric converter PC2 converts the light into a charge. The second charge storage FD2 stores the charge. As the charge is progressively stored in the second charge storage FD2, the potential of the second charge storage FD2 rises.

In the present embodiment, the second photoelectric converter PC2 includes a pair of electrodes E2a and E2b and a second photoelectric conversion layer D2. The second photoelectric conversion layer D2 is disposed between the pair of electrodes E2a and E2b. One of the pair of electrodes E2a and E2b is a second upper electrode E2a. The other of the pair of electrodes E2a and E2b is a second pixel electrode E2b. The second upper electrode E2a faces the second pixel electrode E2b. The second upper electrode E2a may also be referred to as a second counter electrode.

A voltage may be applied to the second upper electrode E2a. With this arrangement, a potential difference occurs between the pair of electrodes E2a and E2b. Consequently, an electric field is applied to the second photoelectric conversion layer D2. With this arrangement, a signal charge produced by photoelectric conversion in the second photoelectric conversion layer D2 is guided to the second pixel electrode E2b. Thereafter, the signal charge is transferred from the second pixel electrode E2b to the second charge storage FD2 and stored in the second charge storage FD2.

In the present embodiment, the second photoelectric conversion layer D2 is a photoelectric conversion film. Specifically, the second photoelectric conversion layer D2 is an organic film. However, the second photoelectric conversion layer D2 may also be an inorganic film.

In the present embodiment, the second upper electrode E2a is a transparent electrode. The transparent electrode is an ITO film, for example.

The second photoelectric converter PC2 may be a photodiode. The second photoelectric converter PC2 which is a photodiode may be provided inside the semiconductor substrate. An aspect in which the second photoelectric converter PC2 is a photodiode is described in detail in the ninth embodiment.

The second imaging cell 1b may also have a second light shield that blocks the incidence of light on the second photoelectric converter PC2. The second imaging cell 1b may also have a second waveguide that guides light to the second photoelectric converter PC2.

The first imaging cell 1a and the second imaging cell 1b may have mutually different structures. Specifically, the imaging device 100 may have at least one characteristic selected from the characteristics listed below. The following characteristics may contribute to raising the sensitivity of the second imaging cell 1b higher than the sensitivity of the first imaging cell 1a.

In a planar view, the area of the second microlens ML2 is larger than the area of the first microlens ML1

In a planar view, the area of the second photoelectric converter PC2 is larger than the area of the first photoelectric converter PC1

In a planar view, the area of the second pixel electrode E2b is larger than the area of the first pixel electrode E1b In a planar view, the area of the second light shield is smaller than the area of the first light shield In a planar view, the area of a light-incident aperture of the second waveguide is smaller than the area of a light-incident aperture of the first waveguide The geometric center of the second photoelectric converter PC2 in a planar view is disposed on the optical axis of the second microlens ML2

The first imaging cell 1a and the second imaging cell 1b may have mutually different effects. Specifically, in the present embodiment, the amount of light that the second photoelectric converter PC2 takes in per unit time is greater than the amount of light that the first photoelectric converter PC1 takes in per unit time.

The first imaging cell 1a and the second imaging cell 1b may have mutually different properties. Specifically, the imaging device 100 may have at least one characteristic selected from the characteristics listed below. In the present embodiment, the imaging device 100 has all of the characteristics listed below.

The second imaging cell 1b has high sensitivity compared to the first imaging cell 1a The second imaging cell 1b has low noise compared to the first imaging cell 1a The first imaging cell 1a has high saturation compared to the second imaging cell 1b The statement "the second imaging cell 1b has high sensitivity compared to the first imaging cell 1a" will be explained. In the present embodiment, the above statement means that in conditions in which a certain amount of white light is incident on the imaging device 100, the quantity of a second signal charge is greater than the quantity of a first signal charge. The quantity of the second signal charge is the quantity of the signal charge generated by the photoelectric conversion, in the second photoelectric converter PC2, of light incident on the second imaging cell 1b. The quantity of the first signal charge is the quantity of the signal charge generated by the photoelectric conversion, in the first photoelectric converter PC1, of light incident on the first imaging cell 1a. The sensitivity depends on the photoelectric converter, the pixel electrode, the waveguide, the microlens, and the light shield.

A ratio Sen2/Sen1 is equal to or greater than 3, for example, where Sen1 is the sensitivity of the first imaging cell 1a and Sen2 is the sensitivity of the second imaging cell 1b. The ratio Sen2/Sen1 may also be equal to or greater than 7, and may also be equal to or greater than 10. The ratio Sen2/Sen1 is less than or equal to 200, for example. The ratio Sen2/Sen1 may also be less than or equal to 100.

The statement "the second imaging cell 1b has low noise compared to the first imaging cell 1a" will be explained. In the present embodiment, the above statement means that in conditions in which a certain amount of white light is incident on the imaging device 100, the SNR of a pixel signal originating from the light incident on the second imaging cell 1b is higher than the SNR of a pixel signal originating from the light incident on the first imaging cell 1a. A pixel signal is a signal taken out to a peripheral circuit.

The statement "the first imaging cell 1a has high saturation compared to the second imaging cell 1b" will be explained. In the present embodiment, the above statement means that in conditions in which the amount of white light incident on the imaging device 100 gradually increases, a first timing occurs later than a second timing. The first timing is the timing at which the rise in the level of the pixel signal originating from the light incident on the first imaging cell 1a levels off. The second timing is the timing at which the rise in the level of the pixel signal originating from the light incident on the second imaging cell 1b levels off.

In the present embodiment, the second imaging cell 1b is responsible for the imaging of dark scenes. For this reason, high saturation properties are of relatively low necessity for the second imaging cell 1b. Conversely, low noise properties are of relatively high necessity for the second imaging cell 1b.

In contrast, the first imaging cell 1a is responsible for the imaging of bright scenes. For this reason, high saturation properties are of relatively high necessity for the first imaging cell 1a. Conversely, low noise properties are of relatively low necessity for the first imaging cell 1a. This is because in the imaging of a bright scene, there is a large amount of light and unpreventable shot noise is dominant type of noise.

The imaging device 100 is provided with first reset signal lines 6a, first address signal lines 7a, first vertical signal lines 9a, first power supply wiring 8a, and first feedback signal lines 10a. The above are elements for use with the first imaging cell 1a. The first reset signal lines 6a are disposed by row. The first address signal lines 7a are disposed by row. The first vertical signal lines 9a are disposed by column. The first power supply wiring 8a is disposed by column. The first feedback signal lines 10a are disposed by column.

The imaging device 100 is provided with second reset signal lines 6b, second address signal lines 7b, second vertical signal lines 9b, second power supply wiring 8b, and second feedback signal lines 10b. The above are elements for use with the second imaging cell 1b. The second reset signal lines 6b are disposed by row. The second address signal lines 7b are disposed by row. The second vertical signal lines 9b are disposed by column. The second power supply wiring 8b is disposed by column. The second feedback signal lines 10b are disposed by column.

A first peripheral circuit and a second peripheral circuit are provided in the imaging device 100. The first peripheral circuit processes signals from the first imaging cell 1a. The second peripheral circuit processes signals from the second imaging cell 1b.

The first peripheral circuit includes a first vertical scan circuit 2a, a first horizontal scan circuit 3a, a first inverting amplifier 11a, a first column analog-to-digital (AD) conversion circuit 4a, and a first current source 5a. The second peripheral circuit includes a second vertical scan circuit 2b, a second horizontal scan circuit 3b, a second inverting amplifier 11b, a second column AD conversion circuit 4b, and a second current source 5b.

With regard to the first imaging cell 1a, the first vertical scan circuit 2a controls the first reset signal lines 6a and the first address signal lines 7a. The first vertical signal lines 9a are connected to the first horizontal scan circuit 3a. The first vertical signal lines 9a convey pixel signals to the first horizontal scan circuit 3a. Specifically, the first column AD conversion circuit 4a is provided on the first vertical signal lines 9a. The first column AD conversion circuit 4a converts analog pixel signals to digital pixel signals and provides the digital pixel signals to the first horizontal scan circuit 3a. The first power supply wiring 8a supplies a power supply voltage to the first imaging cell 1a of all of the pixels 1. The power supply voltage is Vdd, for example. The first inverting amplifier 11a is connected to the first vertical signal lines 9a. The first feedback signal lines 10a convey feedback signals from the first inverting amplifier 11a to the first imaging cell 1a of the pixels 1. The first current source 5a cooperates with a first amplification transistor M10 to form a source follower circuit.

With regard to the second imaging cell 1b, the second vertical scan circuit 2b controls the second reset signal lines 6b and the second address signal lines 7b. The second vertical signal lines 9b are connected to the second horizontal scan circuit 3b. The second vertical signal lines 9b convey pixel signals to the second horizontal scan circuit 3b. Specifically, the second column AD conversion circuit 4b is provided on the second vertical signal lines 9b. The second column AD conversion circuit 4b converts analog pixel signals to digital pixel signals and provides the digital pixel signals to the second horizontal scan circuit 3b. The second power supply wiring 8b supplies a power supply voltage to the second imaging cell 1b of all of the pixels 1. The power supply voltage is Vdd, for example. The second inverting amplifier 11b is connected to the second vertical signal lines 9b. The second feedback signal lines 10b convey feedback signals from the second inverting amplifier 11b to the second imaging cell 1b of the pixels 1. The second current source 5b cooperates with a second amplification transistor M20 to form a source follower circuit.

Note that the reset signal lines 6a and 6b can be unified, depending on the configuration of the pixels 1. The same is also true of the address signal lines 7a and 7b. The feedback signal lines 10a and 10b can be unified or omitted, depending on the configuration of the pixels 1. The same is also true of the inverting amplifiers 11a and 11b, the vertical scan circuits 2a and 2b, and the horizontal scan circuits 3a and 3b.

The first inverting amplifier 11a may be provided by column, inside each pixel 1, or one first inverting amplifier 11a may be provided with respect to multiple pixels 1. The same is also true of the second inverting amplifier 11b.

Circuit Configuration of First Imaging Cell 1a and Second Imaging Cell 1b

An example of the circuit configuration of the first imaging cell 1a and the second imaging cell 1b in the pixel 1 will be described with reference to FIGS. 2 and 3.

The first imaging cell 1a functions as a high-saturation cell. The first imaging cell 1a includes a first photoelectric converter PC1 and a first signal processing circuit P1. The first photoelectric converter PC1 converts light into a charge. The first signal processing circuit P1 is electrically connected to the first photoelectric converter PC1. The first signal processing circuit P1 reads out an electrical signal corresponding to the signal charge generated by the first photoelectric converter PC1.

The first signal processing circuit P1 includes a first amplification transistor M10, a first select transistor M11, and a first reset transistor M12.

The gate electrode of the first amplification transistor M10, the first charge storage FD1, and the first photoelectric converter PC1 are electrically connected. In the present embodiment, the first charge storage FD1 is one of the source or drain of the first reset transistor M12. However, the first charge storage FD1 may also be an element separate from the first reset transistor M12 and electrically connected to the gate electrode of the first amplification transistor M10 and the first photoelectric converter PC1. One of the source or drain of the first select transistor M11, one of the source or drain of the first amplification transistor M10, and the other of the source or drain of the first reset transistor M12 are electrically connected. The other of the source or drain of the first select transistor M11 is electrically connected to a first voltage line VDD1. The other of the source or drain of the first amplification transistor M10 is electrically connected to a first signal line Out1.

The first amplification transistor M10 amplifies an electrical signal corresponding to the signal charge generated by the first photoelectric converter PC1. The first select transistor M11 selectively outputs the signal amplified by the first amplification transistor M10. The first reset transistor M12 resets the first charge storage FD1 connected to the first pixel electrode E1*b* of the first photoelectric converter PC1.

The imaging device 100 includes a first interposing transistor M16, a first following transistor M17, and a first capacitor Cs3. Specifically, the first imaging cell 1*a* includes the first interposing transistor M16, the first following transistor M17, and the first capacitor Cs3. More specifically, the first signal processing circuit P1 includes the first interposing transistor M16, the first following transistor M17, and the first capacitor Cs3.

In the present embodiment, the first interposing transistor M16 may also be referred to as the first charge injection transistor. Specifically, the first interposing transistor M16 may also be referred to as the first electron injection transistor. The first following transistor M17 may also be referred to as the first short transistor.

In the present embodiment, the gate electrode of the first interposing transistor M16 and one of the source or drain of the first interposing transistor M16 are electrically connected to the first charge storage FD1. By energizing or in other words turning on the first interposing transistor M16, the first charge storage FD1 and the first capacitor Cs3 are electrically connected through the first interposing transistor M16. This configuration is suitable for mitigating a decrease in the signal-to-noise ratio (SNR) associated with a decrease in the intensity of light incident on the imaging device 100.

In the present embodiment, by turning on the first following transistor M17, the first capacitor Cs3, one of the source or drain of the first following transistor M17, and the other of the source or drain of the first following transistor M17 are electrically connected in the above order.

In the present embodiment, the other of the source or drain of the first interposing transistor M16 and the first capacitor Cs3 are electrically connected. One of the source or drain of the first following transistor M17 is electrically connected to the first capacitor Cs3. The other of the source or drain of the first following transistor M17 is electrically connected to the first charge storage FD1.

In the present embodiment, the first charge storage FD1 is electrically connected to the gate electrode of the first amplification transistor M10. By turning on the first following transistor M17, the first capacitor Cs3, one of the source or drain of the first following transistor M17, the other of the source or drain of the first following transistor M17, and the gate electrode of the first amplification transistor M10 are electrically connected in the above order.

In the present embodiment, the capacitance value of the first capacitor Cs3 is greater than the capacitance value of the first charge storage FD1. This is suitable for achieving an imaging device 100 with a wide dynamic range. A ratio c3/c1 is equal to or greater than 3, for example, where c1 is the capacitance value of the first charge storage FD1 and c3 is the capacitance value of the first capacitor Cs3. The ratio c3/c1 may also be equal to or greater than 6, and may also be equal to or greater than 10. The ratio c3/c1 may be less than or equal to 1000, for example. The ratio c3/c1 may also be less than or equal to 100, and may also be less than or equal to 50.

The term "capacitor" will be explained. A capacitor is a concept that does not include a parasitic capacitance. A parasitic capacitance is a concept that includes the diffusion region provided in the semiconductor substrate. A capacitor is suitable for securing a capacitance value compared to a parasitic capacitance. In a typical example, a capacitor has a structure in which a dielectric such as an insulating film is sandwiched between electrodes. In this context, the electrodes are not limited to electrodes formed from metal, and should be interpreted to broadly include materials such as a polysilicon layer. In this context, the electrodes may also be a portion of the semiconductor substrate.

In the present embodiment, the first capacitor Cs3 has a metal-insulator-metal structure (hereinafter abbreviated to MIM structure). This is suitable for achieving a high-density capacitor. Note that the "M" in MIM refers to at least one of a metal or a metallic compound. The "I" in MIM is an insulator such as an oxide, for example. In other words, MIM is a concept that includes metal-oxide-metal (MOM).

One example of the material of the insulator in the first capacitor Cs3 is silicon oxide. A different example of the material of the insulator in the first capacitor Cs3 is what is called a high-k material having a higher dielectric constant than silicon oxide. With a high-k material, the capacitance value of the first capacitor Cs3 is easily increased. In one specific example, the insulator of the first capacitor Cs3 contains an oxide of hafnium (Hf) or an oxide of zirconium (Zr) as the main component. Here, the main component means the most abundant component in terms of mass. In one example, the main component is the component exceeding 50% by mass. In one specific example, the main component is the component exceeding 80% by mass.

In the present embodiment, by turning on the first interposing transistor M16, the first charge storage FD1 is electrically connected to one end of the first capacitor Cs3 through the first interposing transistor M16. A DC potential VBW1 is applied to the other end of the first capacitor Cs3. The DC potential VBW1 may be the ground potential or a potential biased from the ground potential.

Hereinafter, the portion of the first capacitor Cs3 that is electrically connected to the first interposing transistor M16 may also be referred to as the first portion FD3.

In the present embodiment, states that the imaging device 100 may take include a first state and a second state. The first state is a state in which the first charge storage FD1 and the first capacitor Cs3 are electrically connected through the first interposing transistor M16. The second state is a state in which a capacitor electrically connected to the first charge storage FD1 is not present. This configuration is suitable for mitigating a decrease in the SNR associated with a decrease in the intensity of light.

In the present embodiment, the second state can be explained as the state in which only a parasitic capacitance exists as a capacitive component electrically connected to the first charge storage FD1.

In the present embodiment, the conductivity type of the gate electrode of the first interposing transistor M16 is the opposite of the conductivity type of the source and the drain of the first interposing transistor M16. With this configuration, the depletion layer under the gate electrode of the first interposing transistor M16 may be reduced. Consequently, according to the above configuration, dark current is easily suppressed. Specifically, in the present embodiment, the gate electrode of the first interposing transistor M16 is of p-type conductivity. The source and the drain of the first interposing transistor M16 are of n-type conductivity. The gate electrode of the first interposing transistor M16 is a polysilicon electrode, for example.

The gate length of the first interposing transistor M16 may be longer than the gate length of the first following transistor M17. The gate length of the first interposing transistor M16 may be the same as the gate length of the first following transistor M17. The gate length of the first interposing transistor M16 may be shorter than the gate length of the first following transistor M17. Here, the gate length refers to the dimension of the gate electrode in relation to the direction from source to drain or from drain to source.

The gate width of the first interposing transistor M16 may be longer than the gate width of the first following transistor M17. The gate width of the first interposing transistor M16 may be the same as the gate width of the first following transistor M17. The gate width of the first interposing transistor M16 may be shorter than the gate width of the first following transistor M17. Here, the gate width refers to the dimension of the gate electrode in relation to the direction orthogonal to the direction of the gate length in a planar view.

The gate thickness of the first interposing transistor M16 may be greater than the gate thickness of the first following transistor M17. The gate thickness of the first interposing transistor M16 may be the same as the gate thickness of the first following transistor M17. The gate thickness of the first interposing transistor M16 may be less than the gate thickness of the first following transistor M17. Here, the gate thickness refers to the thickness of the gate electrode.

The second imaging cell 1b functions as a low-noise cell. The second imaging cell 1b includes a second photoelectric converter PC2 and a second signal processing circuit P2. The second photoelectric converter PC2 converts light into a charge. The second signal processing circuit P2 is electrically connected to the second photoelectric converter PC2. The second signal processing circuit P2 reads out an electrical signal corresponding to the signal charge generated by the second photoelectric converter PC2.

The second signal processing circuit P2 includes a second amplification transistor M20, a second select transistor M21, a second reset transistor M22, a bandwidth control transistor M23, a capacitor Cc1, and a capacitor Cs1.

The gate electrode of the second amplification transistor M20, the second charge storage FD2, the second photoelectric converter PC2, and one end of the capacitor Cc1 are electrically connected. In the present embodiment, the second charge storage FD2 is one of the source or drain of the second reset transistor M22. However, the second charge storage FD2 may also be an element separate from the second reset transistor M22 and electrically connected to the gate electrode of the second amplification transistor M20 and the second photoelectric converter PC2. One of the source or drain of the second select transistor M21, one of the source or drain of the second amplification transistor M20, and one of the source or drain of the bandwidth control transistor M23 are electrically connected. The other of the source or drain of the second select transistor M21 is electrically connected to a second voltage line VDD2. The other of the source or drain of the second reset transistor M22, the other of the source or drain of the bandwidth control transistor M23, the other end of the capacitor Cc1, and one end of the capacitor Cs1 are electrically connected. A DC potential VB1 is applied to the other end of the capacitor Cs1.

The second amplification transistor M20 amplifies an electrical signal corresponding to the signal charge generated by the second photoelectric converter PC2. The second select transistor M21 selectively outputs the signal amplified by the second amplification transistor M20. The second reset transistor M22 resets the second charge storage FD2 connected to the second pixel electrode E2b of the second photoelectric converter PC2. The bandwidth control transistor M23, the capacitor Cc1, and the capacitor Cs1 are used to suppress kTC noise produced when turning off the second reset transistor M22. For details regarding a technology for suppressing kTC noise, refer to Japanese Laid-open Patent Publication No. 2018-117347, for example.

Figure 4:
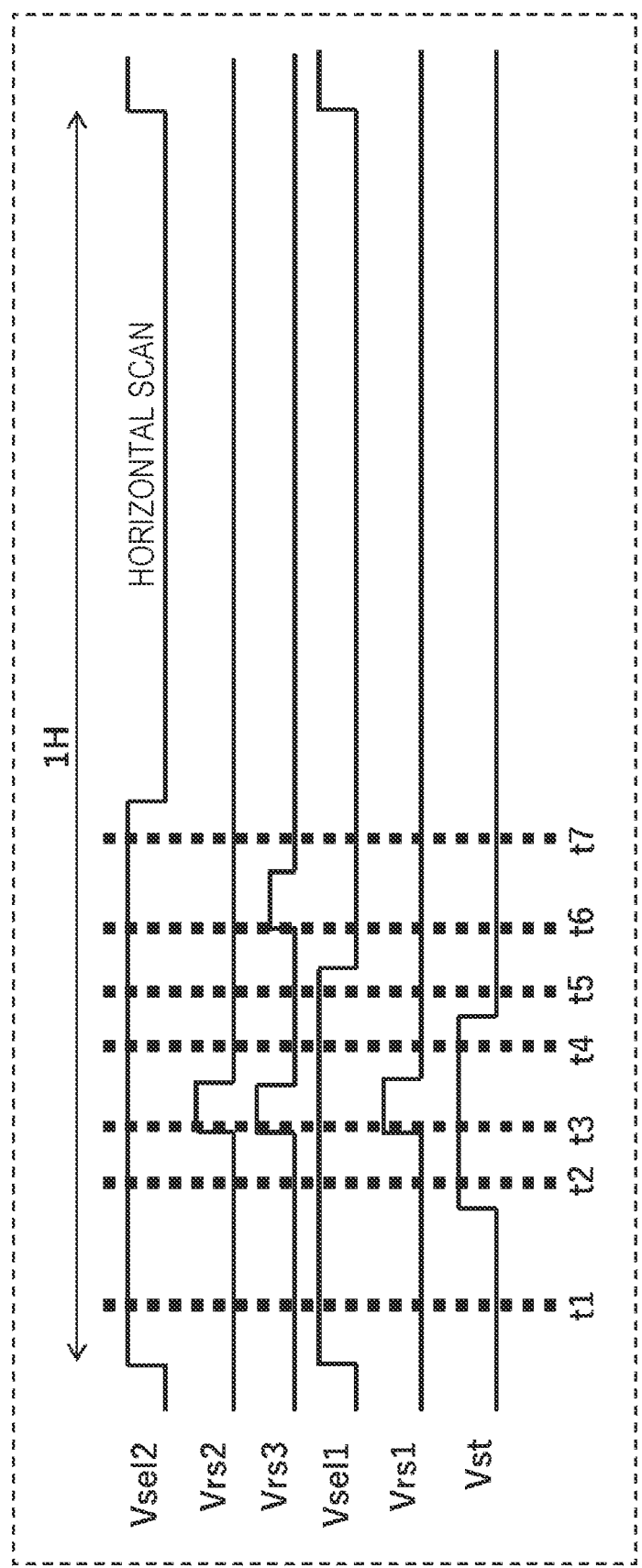
FIG. 4 is a timing chart representing operations by an imaging device.

Hereinafter, FIG. 4 will be used to describe operations by the imaging device 100 according to the present embodiment. FIG. 4 illustrates a timing chart representing operations by the imaging device 100 according to the present embodiment.

In FIG. 4, a period 1H is a control cycle period related to one row of the array formed by the pixels 1. Times t1, t2, t3, t4, t5, t6, and t7 belong to the period 1H. The times t1, t2, t3, t4, t5, t6, and t7 occur in the above order.

A voltage Vsel2 is the voltage of the gate electrode of the second select transistor M21. A voltage Vrs2 is the voltage of the gate electrode of the second reset transistor M22. A voltage Vrs3 is the voltage of the gate electrode of the bandwidth control transistor M23. A voltage Vsel1 is the voltage of the gate electrode of the first select transistor M11. A voltage Vrs1 is the voltage of the gate electrode of the first reset transistor M12. A voltage Vst is the voltage of the gate electrode of the first following transistor M17.

In the example in FIG. 4, basically, the voltages Vsel2, Vrs2, Vrs3, Vsel1, Vrs1, and Vst change between two levels, namely a low level and a high level. However, these voltages may also change among a greater number of levels. Specifically, in the example in FIG. 4, at the time t6, the voltage Vrs3 changes to a middle level. The middle level is an intermediate level between the low level and the high level. A configuration in which the voltage Vrs3 changes between the two levels of the low level and the high level may also be adopted. In one example of this configuration, at the time t6, the voltage Vrs3 changes to the high level.

In the example in FIG. 4, at the time t1, the voltage Vsel2 is at the high level. Consequently, the second select transistor M21 is in the on state. The voltage Vrs2 is at the low level. Consequently, the second reset transistor M22 is in the off state. The voltage Vrs3 is at the low level. Consequently, the bandwidth control transistor M23 is in the off state. The voltage Vsel1 is at the high level. Consequently, the first select transistor M11 is in the on state. The voltage Vrs1 is at the low level. Consequently, the first reset transistor M12 is in the off state. The voltage Vst is at the low level. Consequently, the first following transistor M17 is in the off state.

At the time t1, an electrical signal corresponding to the signal charge stored in the second charge storage FD2 is outputted to the second peripheral circuit through the second amplification transistor M20 and a second signal line Out2 in the above order. Hereinafter, the electrical signal may also be referred to as the pixel signal of the second charge storage FD2 or the second pixel signal $V_{FD2}$. In the present embodiment, the second pixel signal $V_{FD2}$ is a voltage corresponding to the potential of the second charge storage FD2. The level of the second pixel signal $V_{FD2}$ rises continuously as the intensity of the light incident on the imaging device 100 increases. The second signal line Out2 is connected to the second vertical signal line 9b illustrated in FIG. 1.

Additionally, at the time t1, an electrical signal corresponding to the signal charge stored in the first charge storage FD1 is outputted to the first peripheral circuit through the first amplification transistor M10 and the first signal line Out1 in the above order. Hereinafter, the electrical signal may also be referred to as the pixel signal of the first charge storage FD1 or the first pixel signal $V_{FD1}$. In the present embodiment, the first pixel signal $V_{FD1}$ is a voltage corresponding to the potential of the first charge storage FD1. The level of the electrical signal rises continuously as the intensity of the light incident on the imaging device 100 increases. The first signal line Out1 is connected to the first vertical signal line 9a illustrated in FIG. 1.

After the time t1, the voltage Vst is changed from the low level to the high level, turning on the first following transistor M17. For this reason, at the time t2, the first following transistor M17 is in the on state. Accordingly, at the time t2, the first charge storage FD1 and the first portion FD3 are electrically connected through the first following transistor M17.

At the time t2, an electrical signal corresponding to the potential of the first charge storage FD1 and the potential of the first portion FD3 is outputted to the first peripheral circuit through the first amplification transistor M10 and the first signal line Out1 in the above order. The level of the electrical signal rises continuously as the intensity of the light incident on the imaging device 100 increases.

The electrical signal outputted at the time t2 will be described further. In the present embodiment, the capacitance value of the first capacitor Cs3 is greater than the capacitance value of the first charge storage FD1. For this reason, the electrical signal corresponding to the combined potential, in which the potential of the first capacitor Cs3 is reflected more strongly than the potential of the first charge storage FD1, is outputted to the first peripheral circuit through the first amplification transistor M10 and the first signal line Out1 in the above order.

The combined potential will be described using examples of numerical values. When the intensity of light is low, the potential of the first charge storage FD1 is 1 V, the potential of the first portion FD3 is 0 V, the combined potential of the two is 0.1 V, and an electrical signal corresponding to the combined potential is outputted. When the intensity of light increases slightly, the potential of the first charge storage FD1 is 2 V, the potential of the first portion FD3 is 0 V, the combined potential of the two is 0.2 V, and an electrical signal corresponding to the combined potential is outputted. When the intensity of light increases further, the potential of the first charge storage FD1 is 3 V, the potential of the first portion FD3 is 0.6 V, the combined potential of the two is 0.8 V, and an electrical signal corresponding to the combined potential is outputted.

In the present embodiment, the electrical signal corresponding to the combined potential may be referred to as the pixel signal of the first portion FD3 or the third pixel signal $V_{FD3}$.

At a time t3, the voltages Vrs2 and Vrs3 are changed from the low level to the high level, turning on the second reset transistor M22 and the bandwidth control transistor M23. This arrangement resets the potential of the second charge storage FD2.

At the time t3, the voltage Vrs1 is changed from the low level to the high level, turning on the first reset transistor M12. This arrangement resets the potential of the first charge storage FD1 and resets the potential of the first capacitor Cs3, that is, the potential of the first portion FD3.

At the time t4, an electrical signal corresponding to the potential of the first charge storage FD1 and the potential of the first portion FD3 is outputted to the first peripheral circuit through the first amplification transistor M10 and the first signal line Out1 in the above order. The electrical signal is a reset signal related to the combined potential. In the present embodiment, the reset signal related to the combined potential is referred to as the reset signal of the first portion FD3.

After the time t4, the voltage Vst is changed from the high level to the low level, thereby de-energizing or in other words turning off the first following transistor M17. For this reason, at the time t5, the first following transistor M17 is in the off state. Accordingly, at the time t5, the electrical connection between the first charge storage FD1 and the first portion FD3 through the first following transistor M17 is broken.

At the time t5, an electrical signal corresponding to the potential of the first charge storage FD1 is outputted to the first peripheral circuit through the first amplification transistor M10 and the first signal line Out1 in the above order. The electrical signal is the reset signal of the first charge storage FD1.

After the time t5, the voltage Vsel1 is changed from the high level to the low level, turning off the first select transistor M11. For this reason, at the time t6, the first select transistor M11 is in the off state.

At the time t6, Vrs3 is changed from the low level to the middle level. With this arrangement, kTC noise in the second charge storage FD2 may be reduced when the second reset transistor M22 is turned off.

At the time t7, an electrical signal corresponding to the potential of the second charge storage FD2 is outputted to the second peripheral circuit through the second amplification transistor M20 and the second signal line Out2 in the above order. The electrical signal is the reset signal of the second charge storage FD2.

Thereafter, the reset signal of the second charge storage FD2 is subtracted from the second pixel signal $V_{FD2}$ of the second charge storage FD2. With this arrangement, noise in the second pixel signal $V_{FD2}$ is reduced. The reset signal of the first charge storage FD1 is subtracted from the first pixel signal $V_{FD1}$ of the first charge storage FD1. With this arrangement, noise in the first pixel signal $V_{FD1}$ is reduced. Also, the reset signal of the first portion FD3 is subtracted from the third pixel signal $V_{FD3}$ of the first portion FD3. With this arrangement, noise in the third pixel signal $V_{FD3}$ is reduced.

As demonstrated by the explanation using the flowchart in FIG. 4, in the present embodiment, a signal corresponding to the potential of the first capacitor Cs3 is read out, after which a signal corresponding to the potential of the first charge storage FD1 is read out. Specifically, the signal corresponding to the potential of the first capacitor Cs3 is the third pixel signal $V_{FD3}$. The signal corresponding to the potential of the first charge storage FD1 is the first pixel signal $V_{FD1}$.

Figure 5A:
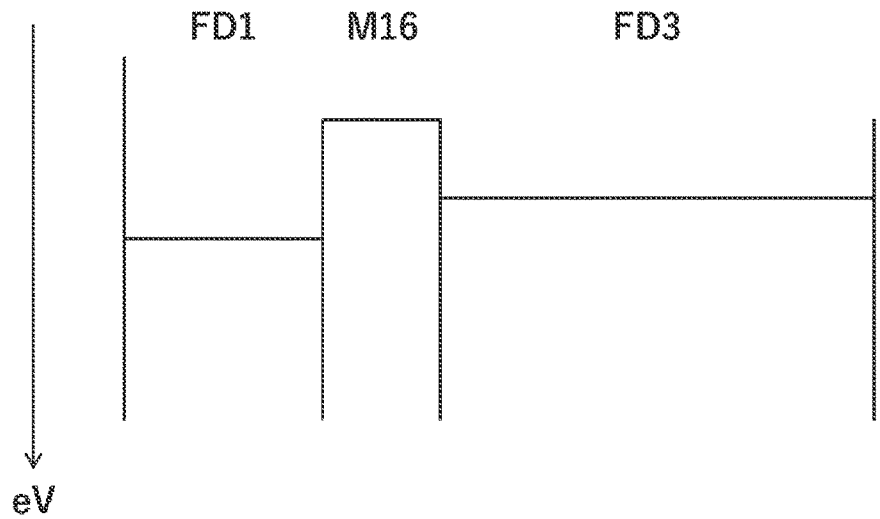
FIG. 5A is an explanatory diagram illustrating the potential of a first charge storage, the gate potential of a first interposing transistor, and the potential of a first portion.
Figure 5B:
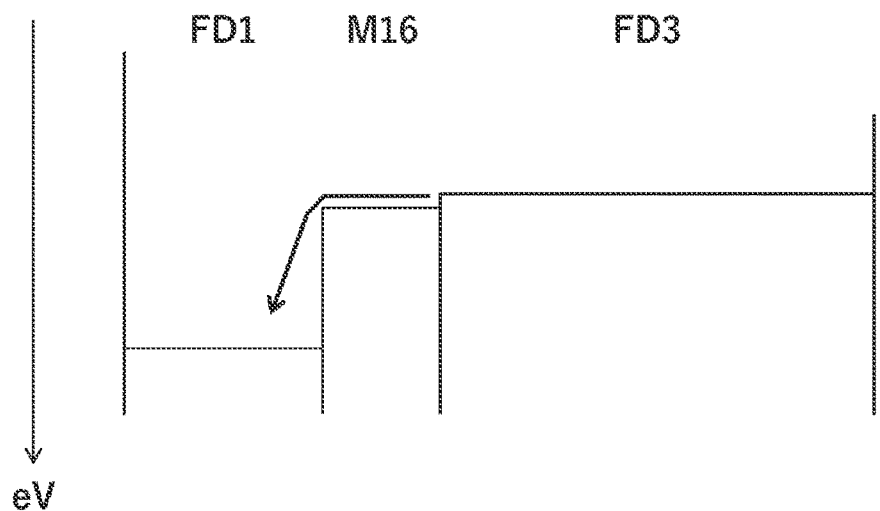
FIG. 5B is an explanatory diagram illustrating the potential of a first charge storage, the gate potential of a first interposing transistor, and the potential of a first portion.
Figure 5C:
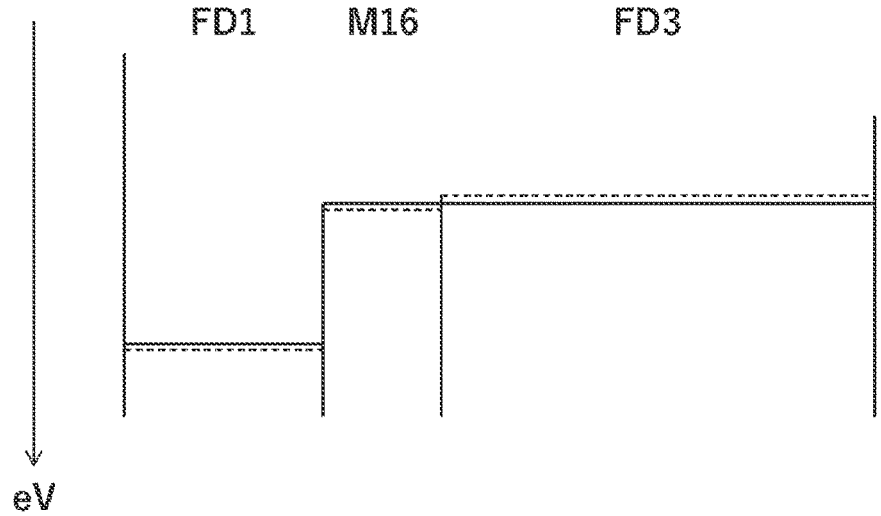
FIG. 5C is an explanatory diagram illustrating the potential of a first charge storage, the gate potential of a first interposing transistor, and the potential of a first portion.

FIGS. 5A to 5C illustrate the potential of the first charge storage FD1, the gate potential of the first interposing transistor M16, and the potential of the first portion FD3. Hereinafter, changes in the potential of the first portion FD3 will be described with reference to FIGS. 5A to 5C. Note that, as described above, the signal charge in the present embodiment is a positive charge, specifically positive holes. Accordingly, FIGS. 5A to 5C also relate to the case where the signal charge is a positive charge.

FIG. 5A illustrates the potential of the first charge storage FD1, the gate potential of the first interposing transistor M16, and the potential of the first portion FD3 in conditions of a low intensity of light incident on the imaging device 100. In these conditions, the first interposing transistor M16 is in the off state. The gate potential of the first interposing transistor M16 is lower than the potential of the first portion FD3. The potential of the first charge storage FD1 is higher than the potential of the first portion FD3.

If the intensity of light increases, the signal charge generated by photoelectric conversion in the first photoelectric converter PC1 increases. The first charge storage FD1 is electrically connected to the first photoelectric converter PC1. For this reason, the potential of the first charge storage FD1 rises. The gate electrode of the first interposing transistor M16 is electrically connected to the first charge storage FD1. Thus, as the potential of the first charge storage FD1 rises, the gate potential of the first interposing transistor M16 also rises accordingly.

If the intensity of light increases further and the potential of the gate electrode of the first interposing transistor M16 exceeds a first threshold potential, the first interposing transistor M16 turns on. With this arrangement, the first charge storage FD1 and the first portion FD3 are electrically connected through the first interposing transistor M16.

If the intensity of light increases further, the potential of the first charge storage FD1 rises further. Accordingly, the gate potential of the first interposing transistor M16 also rises. Before long, the gate potential of the first interposing transistor M16 rises above the potential of the first portion FD3. Like the conditions in FIG. 5A, the potential of the first charge storage FD1 is higher than the potential of the first portion FD3. FIG. 5B illustrates the conditions under which the above magnitude relationships among the potentials are satisfied.

In the conditions illustrated in FIG. 5B, a negative charge is injected from the first portion FD3 into the first charge storage FD1 through the first interposing transistor M16. Specifically, the negative charge is electrons. The arrow in FIG. 5B diagrammatically illustrates the injection of the negative charge.

The injection of the negative charge described above causes the potential of the first charge storage FD1 to fall. Accordingly, the gate potential of the first interposing transistor M16 also falls. On the other hand, the potential of the first portion FD3 rises. In FIG. 5C, the changes due to the injection of the negative charge are illustrated diagrammatically. Specifically, the potentials before the injection of the negative charge are indicated by the dashed lines. The potentials after the injection of the negative charge are indicated by the solid lines.

In the present embodiment, the potential of the first charge storage FD1 and the potential of the first portion FD3 are balanced by such injection of the negative charge. In conditions in which the intensity of the light incident on the imaging device 100 increases, the potential of the first charge storage FD1 and the potential of the first portion FD3 may rise while remaining balanced.

A similar phenomenon also occurs in the case where the signal charge is a negative charge.

The following technical features are derived from the above description. Namely, an increase in one of either a positive or a negative charge generated by photoelectric conversion in the first photoelectric converter PC1 causes an increase in one of either a positive or a negative charge stored in the first charge storage FD1. An increase in one of either a positive or a negative charge stored in the first charge storage FD1 causes the potential of the first charge storage FD1 to do one of either rise or fall. Either a rise or a fall in the potential of the first charge storage FD1 causes a first phenomenon and a second phenomenon to appear, in that order. The first phenomenon is the turning on of the first interposing transistor M16. The second phenomenon is the supplying of the other of either a positive or a negative charge from the first capacitor Cs3 to the first charge storage FD1 through the first interposing transistor M16. The supplying causes the potential of the first charge storage FD1 to do the other of either rise or fall.

As the above description demonstrates, in conditions in which the intensity of light increases and potential of the gate electrode of the first interposing transistor M16 exceeds the first threshold potential, the potential of the first portion FD3 may change. This means that the potential of the first portion FD3 may be utilized as information that changes depending on the intensity of the light incident on the imaging device 100.

In the present embodiment, the following may be said regarding the second pixel signal $V_{FD2}$ of the second charge storage FD2, the first pixel signal $V_{FD1}$ of the first charge storage FD1, and the third pixel signal $V_{FD3}$ of the first portion FD3.

The second imaging cell 1b is a high-sensitivity, low-noise, and low-saturation imaging cell compared to the first imaging cell 1a. The SNR of the second pixel signal $V_{FD2}$ of the second charge storage FD2 belonging to the second imaging cell 1b is defined to be a second SNR $SN_{FD2}$. In the region where the intensity of light incident on the imaging device 100 is low, the second SNR $SN_{FD2}$ rises from near zero as the intensity increases.

The first imaging cell 1a is a low-sensitivity, high-noise, and high-saturation imaging cell compared to the second imaging cell 1b. The SNR of the first pixel signal $V_{FD1}$ of the first charge storage FD1 belonging to the first imaging cell 1a is defined to be a first SNR $SN_{FD1}$. In a region of high intensity compared to the second SNR $SN_{FD2}$, the first SNR $SN_{FD1}$ rises from near-zero as the intensity increases.

The first portion FD3, like the first charge storage FD1, belongs to the first imaging cell 1a. The SNR of the third pixel signal $V_{FD3}$ of the first portion FD3 is defined to be a third SNR $SN_{FD3}$. In a region of high intensity compared to the first SNR $SN_{FD1}$, the third SNR $SN_{FD3}$ rises from near-zero as the intensity increases.

Figure 6:
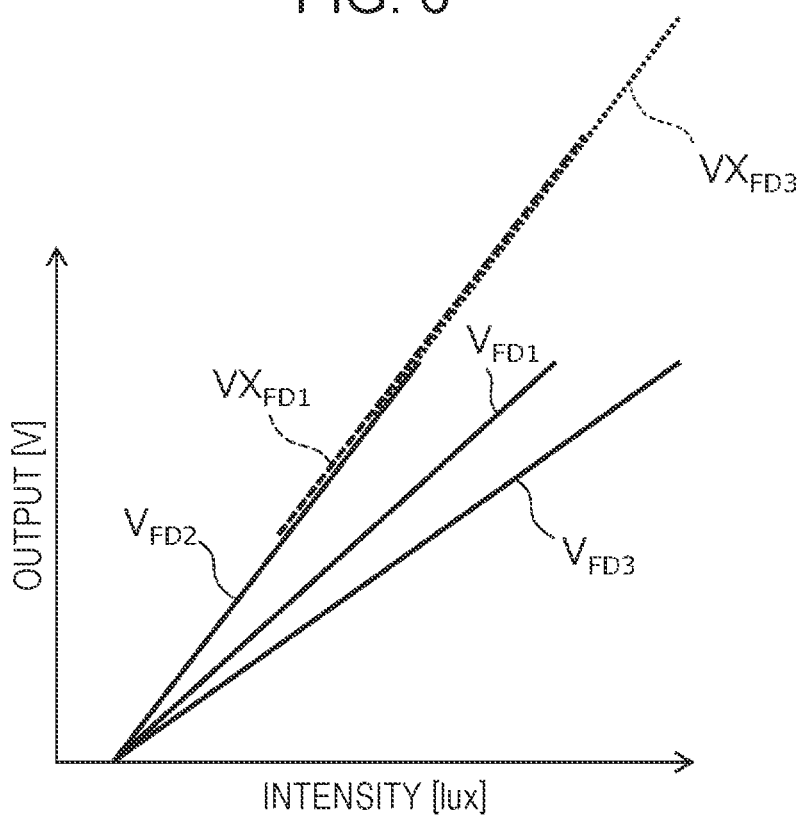
FIG. 6 is a graph illustrating the relationships of a second pixel signal, a first pixel signal, and a third pixel signal with respect to the intensity of light incident on an imaging device.
Figure 7:
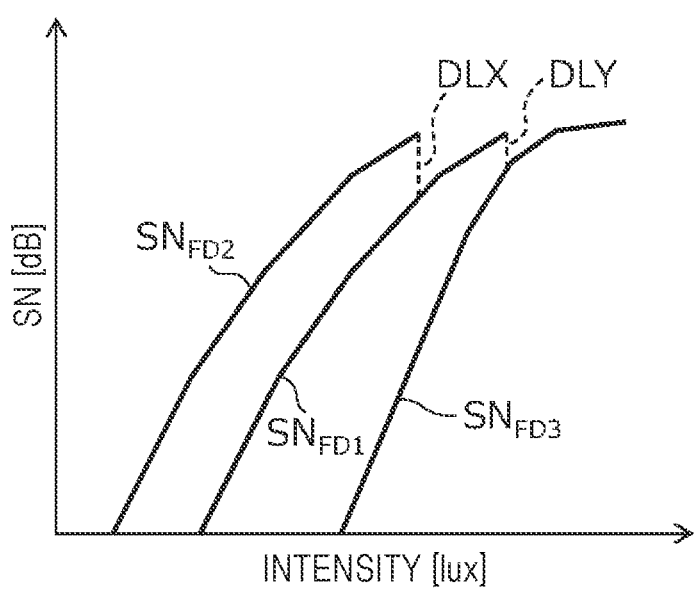
FIG. 7 is a graph illustrating the relationships of a second signal-to-noise ratio (SNR), a first SNR, and a third SNR with respect to the intensity of light incident on an imaging device.

FIG. 6 is a graph illustrating the relationships of the second pixel signal $V_{FD2}$, the first pixel signal $V_{FD1}$, and the third pixel signal $V_{FD3}$ with respect to the intensity of light incident on the imaging device 100. FIG. 7 is a graph illustrating the relationships of the second SNR $SN_{FD2}$, the first SNR $SN_{FD1}$, and the third SNR $SN_{FD3}$ with respect to the intensity of light incident on the imaging device 100. The horizontal axis of FIGS. 6 and 7 represents the intensity of light incident on the imaging device 100. The units of the intensity are lux. The vertical axis of FIG. 6 represents the level of the outputted pixel signal. The units of the level are volts (V). The vertical axis of FIG. 7 is the SNR. The units of the SNR are decibels (dB). FIGS. 6 and 7 visually demonstrate that, according to the present embodiment, three output lines that change depending on the intensity of light are obtained. In FIG. 6, the output lines represent the pixel signals. In FIG. 7, the output lines represent the SNRs.

Specifically, one of the three output lines originates from the high-sensitivity second imaging cell 1b. Two of the three output lines originate from the low-sensitivity first imaging cell 1a. In the first imaging cell 1a, if the intensity increases, the potential of the first portion FD3 starts to change with a delay compared to the potential of the first charge storage FD1. In this way, two output lines originating from the first imaging cell 1a are generated.

Figure 8:
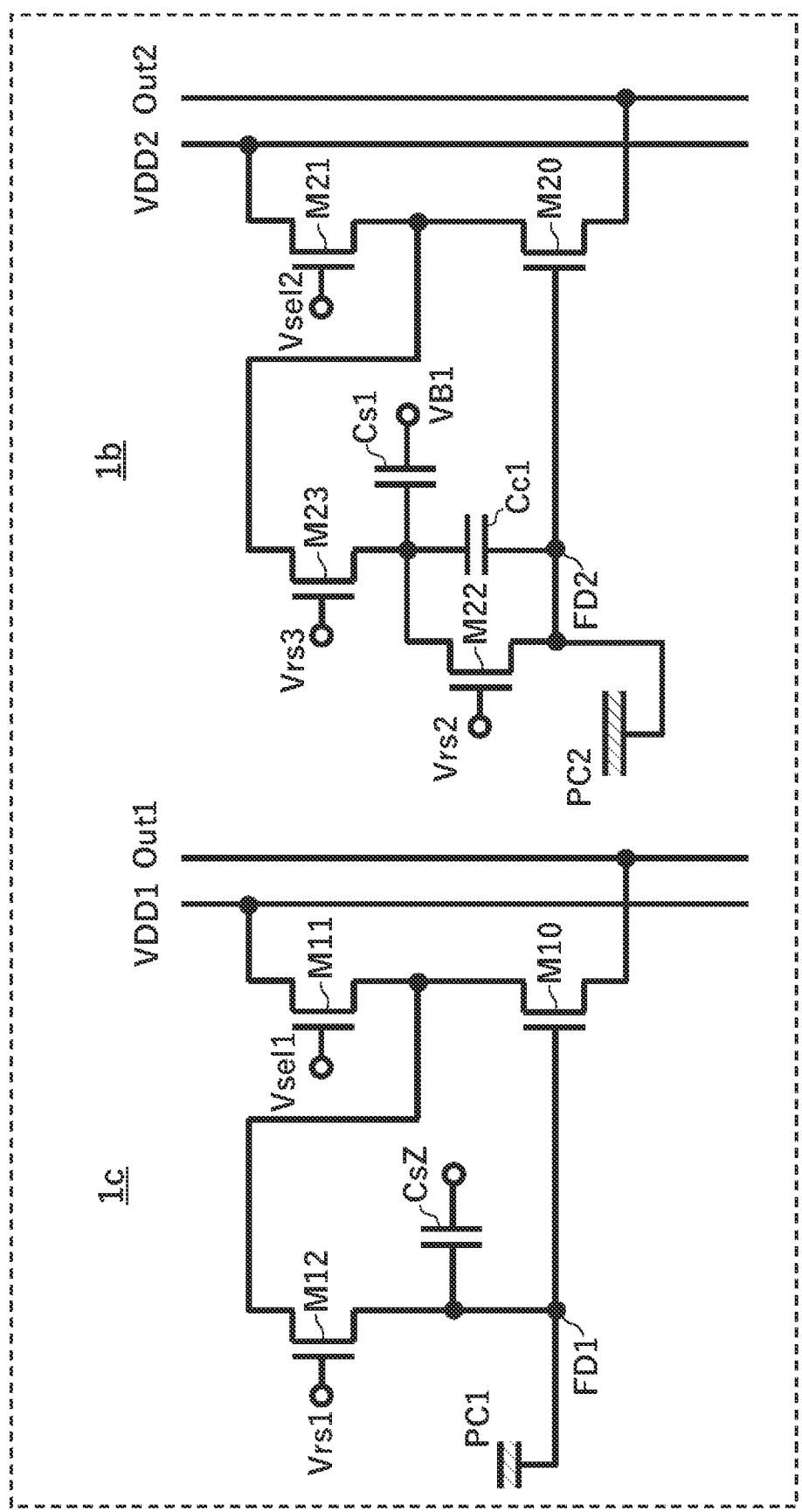
FIG. 8 is a schematic diagram illustrating a circuit configuration of a pixel of an imaging device according to a reference form.

FIG. 8 is a schematic diagram illustrating a circuit configuration of a pixel of an imaging device according to a reference form. Unlike the first imaging cell 1a in FIG. 3, in a first imaging cell 1c of the reference form, the first interposing transistor M16, the first following transistor M17, and the first capacitor Cs3 are not present, while on the other hand a capacitor CsZ is present. One end of the capacitor CsZ is electrically connected to the first charge storage FD1. A DC potential is applied to the other end of the capacitor CsZ. In this example, the capacitance value of the capacitor CsZ is substantially the same as the capacitance value of the first capacitor Cs3. These capacitance values may also be considered to be the same in a strict sense.

In the first imaging cell 1c in FIG. 8, since the first capacitor Cs3 is not present, the third pixel signal $V_{FD3}$ is not obtained. On the other hand, in the first imaging cell 1c, the capacitor CsZ is electrically connected to the first charge storage FD1. Furthermore, the capacitance value of the capacitor CsZ is substantially the same as the capacitance value of the first capacitor Cs3. Accordingly, the first pixel signal $V_{FD1}$ of the reference form resembles the third pixel signal $V_{FD3}$ of the present embodiment. Also, the first SNR $SN_{FD1}$ of the reference form resembles the third SNR $SN_{FD3}$ of the present embodiment.

On the other hand, a second imaging cell 1b in FIG. 8 is the same as the second imaging cell 1b in FIG. 3. Accordingly, the second pixel signal $V_{FD2}$ of the reference form is the same as the second pixel signal $V_{FD2}$ of the present embodiment. Also, the second SNR $SN_{FD2}$ of the reference form is the same as the second SNR $SN_{FD2}$ of the present embodiment.

Figure 9:
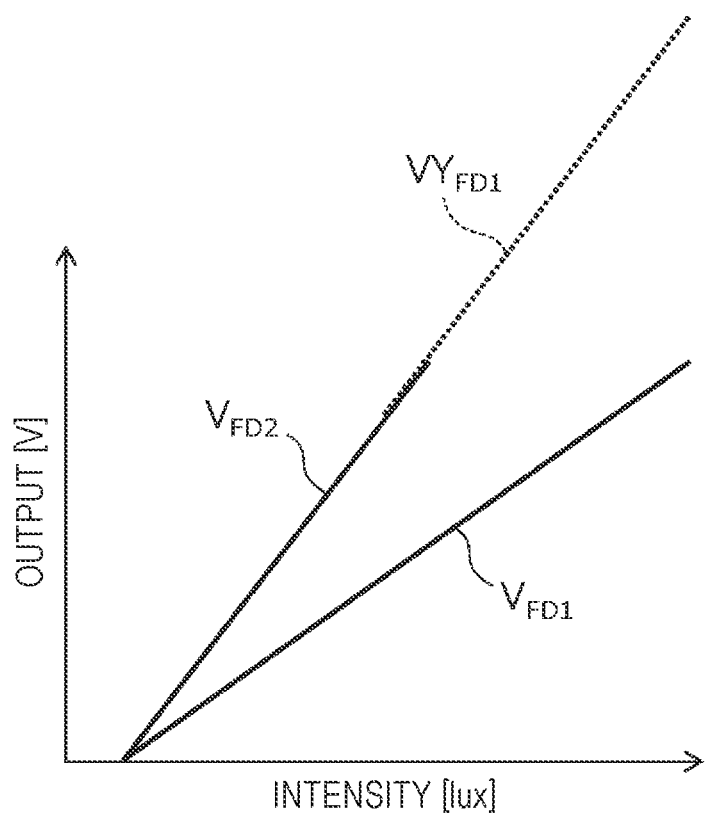
FIG. 9 is a graph illustrating the relationships of a second pixel signal and a first pixel signal with respect to the intensity of light incident on an imaging device according to a reference form.
Figure 10:
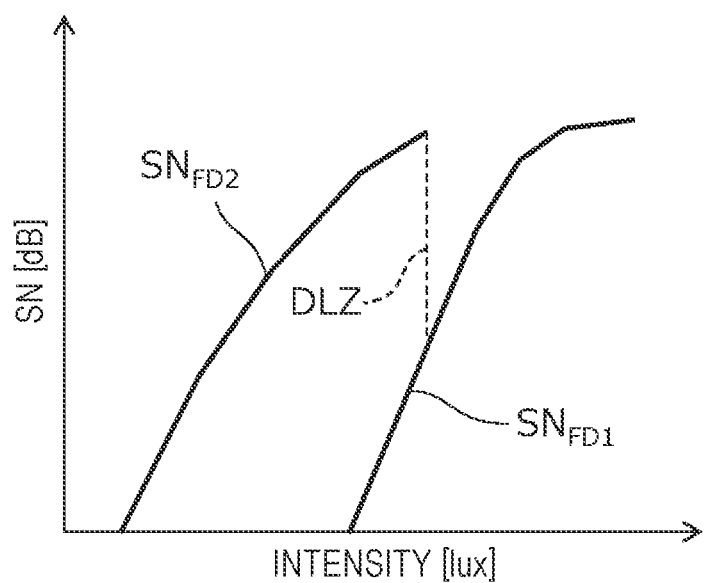
FIG. 10 is a graph illustrating the relationships of a second SNR and a first SNR with respect to the intensity of light incident on an imaging device according to a reference form.

FIG. 9 is a graph illustrating the relationships of the second pixel signal $V_{FD2}$ and the first pixel signal $V_{FD1}$ with respect to the intensity of light incident on the imaging device according to the reference form. FIG. 10 is a graph illustrating the relationships of the second SNR $SN_{FD2}$ and the first SNR $SN_{FD1}$ with respect to the intensity of light incident on the imaging device according to the reference form. The horizontal axis of FIGS. 9 and 10 represents the intensity of light incident on the imaging device. The units of the intensity are lux. The vertical axis of FIG. 9 represents the level of the outputted pixel signal. The units of the level are volts (V). The vertical axis of FIG. 10 is the SNR. The units of the SNR are decibels (dB).

Incidentally, a variety of methods exist as technologies for achieving an imaging device with a wide dynamic range. Among this variety of methods, a time-division method, a space-division method, an in-pixel memory method, and a 1-pixel, 2-cell method will be described.

In the time-division method, images are taken at different sensitivities by time division. Thereafter, the obtained images are combined.

In the space-division method, images are taken by light-receiving elements having different sensitivities. Thereafter, the obtained images are combined. The space-division method is described in Japanese Laid-open Patent Publication No. 2006-253876, for example.

In the in-pixel memory method, each pixel is provided with a memory that stores the charge overflowing from the photodiode. This arrangement increases the quantity of charge that can be stored in a single exposure period. The in-pixel memory method is described in Japanese Patent No. 4317115, for example.

In a typical example of the 1-pixel, 2-cell method, two imaging cells with different sensitivities are formed inside a single pixel. Additionally, a memory that stores a charge is provided in the low-sensitivity cell. The 1-pixel, 2-cell method is described in International Publication No. WO 2016/147885 and Japanese Laid-open Patent Publication No. 2018-117347, for example. Specifically, in International Publication No. WO 2016/147885, a photodiode is used as the photoelectric converter. In Japanese Laid-open Patent Publication No. 2018-117347, a multilayer imaging device is configured.

In the time-division method and the space-division method, the dynamic range can be expanded by increasing the number of divisions. However, increasing the number of divisions leads to artifacting, lowered resolution, and degraded image quality.

In the in-pixel memory method, the memory capacity is limited. Consequently, there is a limit to how much the dynamic range can be expanded.

In the 1-pixel, 2-cell method, a side dynamic range is achieved using a first imaging cell and a second imaging cell. However, if a large gap exists between the intensity region where the first imaging cell exhibits sensitivity and the intensity region where the second imaging cell exhibits sensitivity, degraded image quality may occur in the intermediate region between the two intensity regions. Hereinafter, the above issue will be described with reference to FIGS. 8 to 10.

In the reference form illustrated in FIG. 8, the 1-pixel, 2-cell method is achieved by including the first imaging cell 1c and the second imaging cell 1b inside a single pixel. FIG. 9 illustrates a line representing the second pixel signal $V_{FD2}$ originating from the second imaging cell 1b and a line representing the first pixel signal $V_{FD1}$ originating from the first imaging cell 1c. FIG. 10 illustrates a line representing the second SNR $SN_{FD2}$ related to the second pixel signal $V_{FD2}$ and a line representing the first SNR $SN_{FD1}$ related to the first pixel signal $V_{FD1}$.

FIG. 9 further illustrates a line representing a corrected first pixel signal $VY_{FD1}$. The corrected first pixel signal $VY_{FD1}$ is the first pixel signal $V_{FD1}$ multiplied by a coefficient. In FIG. 9, the line representing the second pixel signal $V_{FD2}$ and the line representing the corrected first pixel signal $VY_{FD1}$ form a partially overlapping part. The two lines appear to form a continuous single line.

Specifically, the coefficient is software-determined so that the overlapping part is produced. Additionally, the data of the second pixel signal $V_{FD2}$ and the data of the first pixel signal $V_{FD1}$ multiplied by the coefficient are joined at the seam, that is, a portion belonging to the overlapping part. In this way, the data of a combined signal is obtained. In the reference form, a wide dynamic range is achieved by generating a combined signal in this way.

In FIG. 10, the seam is schematically represented by a dashed line DLZ. The intensity at the seam is such that the second SNR $SN_{FD2}$ related to the second pixel signal $V_{FD2}$ is high, while the first SNR $SN_{FD1}$ related to the first pixel signal $V_{FD1}$ is low. This means that the SNR related to the combined signal drops suddenly in the seam portion. Hereinafter, the SNR after the sudden drop will be referred to as the seam SNR. In the reference form, there is a problem in that the seam SNR is low, and under moderate light intensity, the noise increases and the image quality is easily degraded.

According to the present embodiment illustrated in FIGS. 1 to 7, the above problem may be mitigated. This point will be explained with reference to FIGS. 6 and 7.

The line representing the second pixel signal $V_{FD2}$ in FIG. 6 related to the present embodiment is the same as the line representing the second pixel signal $V_{FD2}$ in FIG. 9 related to the reference form. The line representing the third pixel signal $V_{FD3}$ in FIG. 6 resembles the line representing the first pixel signal $V_{FD1}$ in FIG. 9. Furthermore, in the present embodiment, as illustrated in FIG. 6, the line representing the first pixel signal $V_{FD1}$ exists between the line representing the second pixel signal $V_{FD2}$ and the line representing the third pixel signal $V_{FD3}$.

Moreover, FIG. 6 illustrates a line representing a corrected first pixel signal $VX_{FD1}$ and a line representing a corrected third pixel signal $VX_{FD3}$. The corrected first pixel signal $VX_{FD1}$ is the first pixel signal $V_{FD1}$ multiplied by a first coefficient. The corrected third pixel signal $VX_{FD3}$ is the third pixel signal $V_{FD3}$ multiplied by a second coefficient. In FIG. 6, the line representing the second pixel signal $V_{FD2}$ and the line representing the corrected first pixel signal $VX_{FD1}$ form a first partially overlapping part, while the line representing the corrected first pixel signal $VX_{FD1}$ and the line representing the corrected third pixel signal $VX_{FD3}$ form a second partially overlapping part. The three lines appear to form a continuous single line.

Specifically, the first coefficient is software-determined so that the first overlapping part is produced, and the second coefficient is software-determined so that the second overlapping part is produced. Additionally, the data of the second pixel signal $V_{FD2}$ and the data of the first pixel signal $V_{FD1}$ multiplied by the first coefficient are joined at a first seam, that is, a portion belonging to the first overlapping part. The data of the first pixel signal $V_{FD1}$ multiplied by the first coefficient and the data of the third pixel signal $V_{FD3}$ multiplied by the second coefficient are joined at a second seam, that is, a portion belonging to the second overlapping part. In this way, the data of a combined signal is obtained. In the present embodiment, a wide dynamic range is achieved by generating a combined signal in this way.

In FIG. 7, the first seam is schematically represented by a dashed line DLX. The second seam is schematically represented by a dashed line DLY. The line representing the second SNR $SN_{FD2}$ in FIG. 7 related to the present embodiment is the same as the line representing the second SNR $SN_{FD2}$ in FIG. 10 related to the reference form. The line representing the third SNR $SN_{FD3}$ in FIG. 7 resembles the line representing the first SNR $SN_{FD1}$ in FIG. 10. Furthermore, in FIG. 7 related to the present embodiment, the line representing the first SNR $SN_{FD1}$ exists between the line representing the second SNR $SN_{FD2}$ and the line representing the third SNR $SN_{FD3}$. Consequently, the magnitude of the drop in the SNR at the first seam is limited. Hereinafter, the SNR after the drop will be referred to as the first seam SNR. The magnitude of the drop in the SNR at the second seam is also limited. Hereinafter, the SNR after the drop will be referred to as the second seam SNR.

As the above description demonstrates, the first seam SNR and the second seam SNR of the present embodiment tends to be higher than the SNR of the reference form. Thus, the present embodiment suppress noise and image quality degradation at intermediate intensity more readily compared to the reference form.

Figure 11:
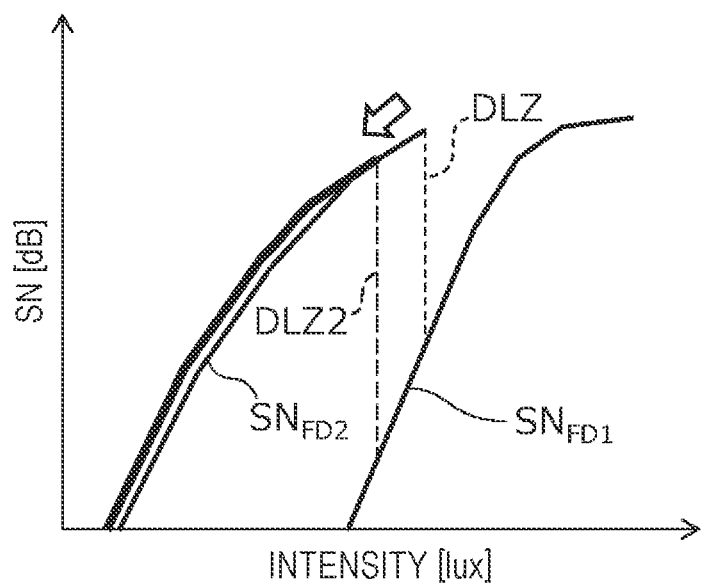
FIG. 11 is an explanatory diagram illustrating a change in the relationship of the SNR with respect to the intensity of light caused by increasing the gain of a high-sensitivity cell in a reference form.
Figure 12:
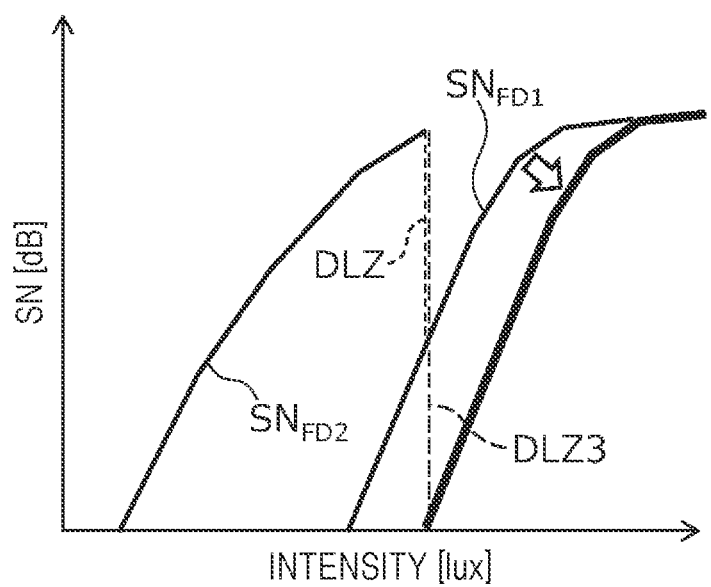
FIG. 12 is an explanatory diagram illustrating a change in the relationship of the SNR with respect to the intensity of light caused by increasing SPLIT in a reference form.

Effects of the present embodiment will be described further with reference to FIGS. 11 and 12. FIG. 11 illustrates a change in the relationship of the SNR with respect to the intensity of light caused by increasing the gain of the high-sensitivity cell 1b of the reference form. FIG. 12 illustrates a change in the relationship of the SNR with respect to the intensity of light caused by increasing SPLIT in the reference form. The horizontal axis of FIGS. 11 and 12 represents the intensity of light incident on the imaging device. The units of the intensity are lux. The vertical axis of FIG. 11 represents the level of the outputted pixel signal. The units of the level are volts (V). The vertical axis of FIG. 12 is the SNR. The units of the SNR are decibels (dB).

The dynamic range of the imaging device of the reference form according to FIG. 8 can be given by the following equation 1. In equation 1, DR is the dynamic range. Also, S is the saturation level of the pixel signal determined on the basis of the first charge storage FD1 and the capacitor CsZ of the low-sensitivity cell 1c. Also, N is the overall noise level of the imaging device. Also, SPLIT is the sensitivity ratio, that is, the ratio of the sensitivity of the high-sensitivity cell 1b to the sensitivity of the low-sensitivity cell 1c (sensitivity of high-sensitivity cell 1b/sensitivity of low-sensitivity cell 1c). Also, "*" is the multiplication sign.

$$DR\ [dB]=20\ \log(S/N*SPLIT) \qquad \text{Equation 1:}$$

To expand the dynamic range of the imaging device of the reference form, the following adjustments are conceivable.
(i) Decrease N by increasing the gain of the high-sensitivity cell 1b
(ii) Increase SPLIT by lowering the sensitivity of the low-sensitivity cell 1c If the above adjustment (i) is made, the saturation level of the high-sensitivity cell 1b is lowered. Additionally, as indicated by the white arrow in FIG. 11, the line representing the second SNR $SN_{FD2}$ is shifted to the left overall, and the upper-right end of the same line is shifted to the down and to the left. In FIG. 11, the line representing the second SNR $SN_{FD2}$ after the shift is illustrated by a thick line. Along with the shift of the line representing the second SNR $SN_{FD2}$, the dashed line DLZ is shifted to a dashed line DLZ2. In FIG. 11, the lower end of the dashed line DLZ2 is located below the lower end of the dashed line DLZ. This means that if the above adjustment (i) is made, the seam SNR will drop. Note that the gain can be increased by adjusting the second inverting amplifier 11b.

If the above adjustment (ii) is made, as indicated by the white arrow in FIG. 12, the line representing the first SNR $SN_{FD1}$ is shifted to the right overall. In FIG. 12, the line representing the first SNR $SN_{FD1}$ after the shift is illustrated by a thick line. Along with the shift of the line representing the first SNR $SN_{FD1}$, the dashed line DLZ is shifted to a dashed line DLZ3. In FIG. 12, the lower end of the dashed line DLZ3 is located below the lower end of the dashed line DLZ. This means that if the above adjustment (ii) is made, the seam SNR will drop.

In this way, in the reference form, attempting to expand the wide dynamic range through adjustment of the imaging device causes the seam SNR to drop. As described above, a drop in the seam SNR leads to noise and image quality degradation under moderate light intensity. In this way, it is not easy to achieve both a wide dynamic range and high image quality under moderate light intensity through adjustment of the imaging device of the reference form. As the description referencing FIGS. 11 and 12 demonstrates, achieving both of the above effects is difficult when there is a single SNR line obtained from the high-sensitivity cell and a single SNR line obtained from the low-sensitivity cell.

In contrast, in the present embodiment, as illustrated in FIG. 7, more than one SNR lines are obtained from the low-sensitivity cell. This alleviates the difficulty of achieving both of the above effects.

According to the present embodiment, two imaging cells 1b and 1a with different circuit configurations can be provided inside each pixel 1. The second imaging cell 1b functions as an imaging cell for low noise and high sensitivity. The first imaging cell 1a functions as an imaging cell for high saturation and low sensitivity. Consequently, a subject with large contrast of brightness and darkness can be imaged without blown-out highlights and crushed blacks. An adequate SNR can be obtained even under moderate light intensity. Moreover, in the present embodiment, high-sensitivity image capture and low-sensitivity image capture can be performed at the same time by the two imaging cells 1b and 1a. For this reason, a time lag between the image captures can be suppressed.

Hereinafter, several other embodiments will be described. In the following, elements shared in common between the embodiment already described and an embodiment described thereafter are denoted with the same reference signs, and a description of such elements may be omitted. The descriptions regarding each of the embodiments may be applied to one other unless the result is technologically inconsistent. The embodiments may also be combed with each other in technologically non-contradictory ways.

Second Embodiment

Figure 13:
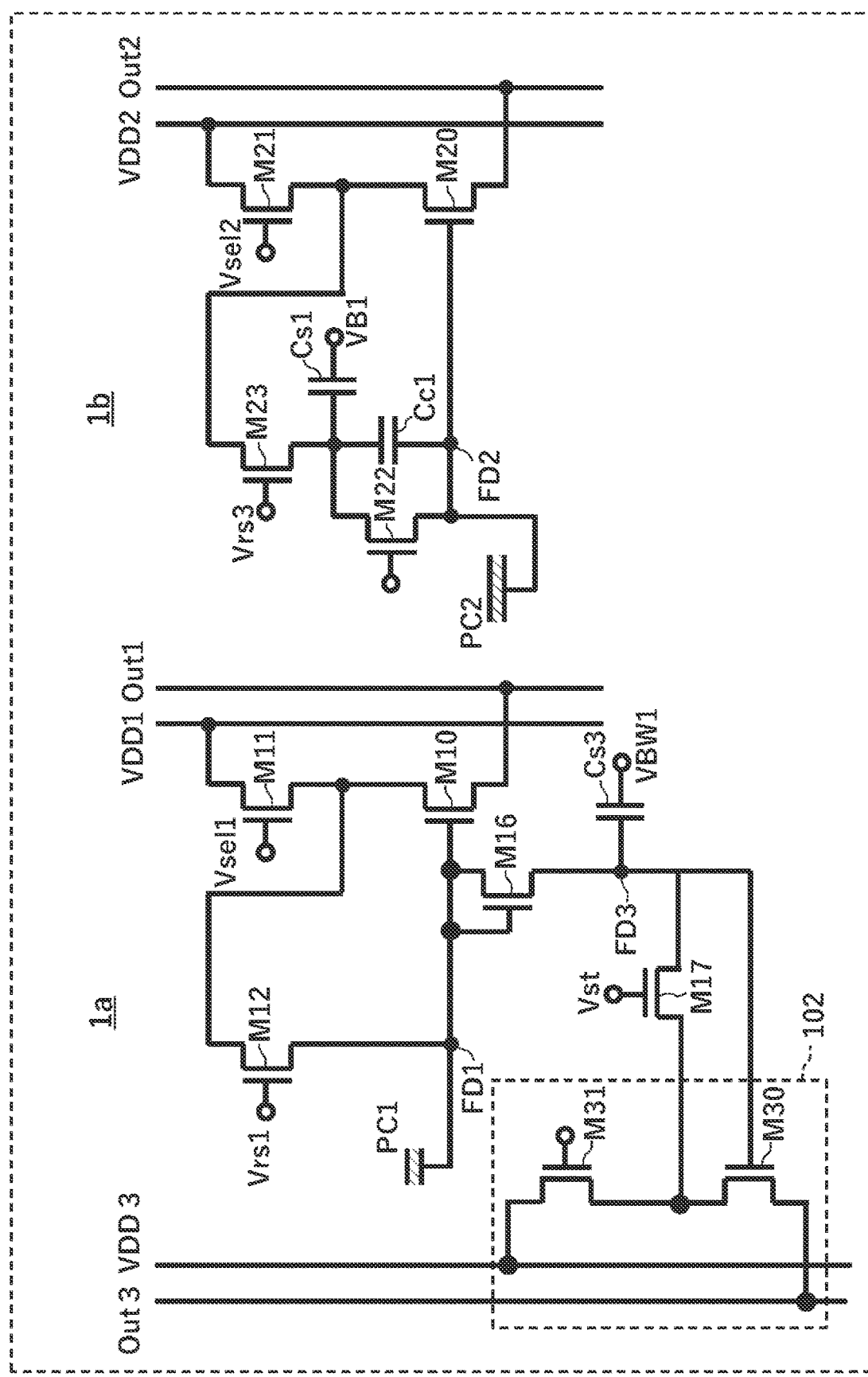
FIG. 13 is a schematic diagram illustrating a circuit configuration of a pixel of an imaging device according to a second embodiment.

FIG. 13 illustrates a circuit configuration of a pixel 1 of an imaging device 100 according to a second embodiment.

The imaging device 100 according to the second embodiment includes an output circuit 102. The output circuit 102 includes an additional amplification transistor M30 and an additional select transistor M31. Specifically, the first imaging cell 1a includes the output circuit 102. More specifically, the first signal processing circuit P1 includes the output circuit 102.

In the following example, a positive charge is used as the signal charge. Specifically, positive holes are used as the signal charge. Also, the transistors M10, M11, M12, M16, M17, M20, M21, M22, M23, M30, and M31 are n-type transistors. Specifically, the transistors are n-type MOSFETs.

However, a negative charge may also be used as the signal charge. Specifically, electrons may be used as the signal charge. In this case, p-type transistors can be used as the transistors M10, M11, M12, M16, M17, M20, M21, M22, M23, M30, and M31. Specifically, in this case, p-type MOSFETs can be used as the transistors.

The first charge storage FD1 is electrically connected to the gate electrode of the first amplification transistor M10. The first capacitor Cs3 is electrically connected to the gate electrode of the additional amplification transistor M30. The first capacitor Cs3 is also electrically connected to the output circuit 102.

One of the source or drain of the first following transistor M17 is electrically connected to the first capacitor Cs3. One of the source or drain of the additional select transistor M31, the other of the source or drain of the first following transistor M17, and one of the source or drain of the additional amplification transistor M30 are electrically connected. The other of the source or drain of the additional select transistor M31 is electrically connected to a third voltage line VDD3. The other of the source or drain of the additional amplification transistor M30 is electrically connected to a third signal line Out3.

The additional amplification transistor M30 amplifies an electrical signal corresponding to the potential of the first capacitor Cs3. The additional select transistor M31 selectively outputs the signal amplified by the additional amplification transistor M30. The first following transistor M17 resets the first capacitor Cs3. In this way, in the present embodiment, the first following transistor M17 functions as a reset transistor.

Specifically, in the present embodiment, in the state with the additional select transistor M31 turned on, the third pixel signal $V_{FD3}$ corresponding to the potential of the first capacitor Cs3 is outputted to the first peripheral circuit through the additional amplification transistor M30 and the third signal line Out3 in the above order. The third signal line Out3 is connected to the first vertical signal line 9a illustrated in FIG. 1.

Also, in the state with the additional select transistor M31 turned on, the first following transistor M17 is turned on. This arrangement resets the potential of the first capacitor Cs3, that is, the potential of the first portion FD3. In addition, a reset signal corresponding to the potential of the first portion FD3 is outputted to the first peripheral circuit through the additional amplification transistor M30 and the third signal line Out3 in the above order. By subtracting the reset signal from the third pixel signal $V_{FD3}$, noise in the third pixel signal $V_{FD3}$ is reduced.

Figure 14:
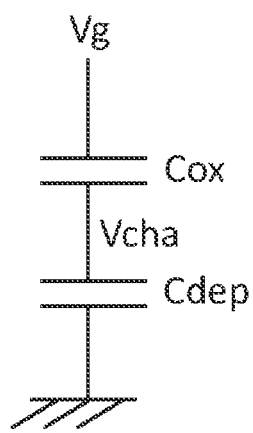
FIG. 14 is an explanatory diagram for explaining the modulation factor of a first interposing transistor.

According to the first embodiment, the imaging device 100 can be configured simply. According to the second embodiment, the dynamic range is easily expanded compared to the first embodiment. Hereinafter, this advantage related to the second embodiment will be described with reference to FIG. 14. FIG. 14 is an explanatory diagram for explaining the modulation factor of the first interposing transistor M16.

In the second embodiment, a gate oxide film capacitance Cox and a depletion layer capacitance Cdep exist in the first interposing transistor M16. Suppose that the voltage of the gate electrode of the first interposing transistor M16 is changed by ΔVg. In this case, the change ΔVcha in the voltage of the gate potential of the first interposing transistor M16 is given by the following equation 2.

$$\Delta Vcha = \Delta Vg * Cox/(Cox+Cdep)$$  Equation 2:

The term Cox/(Cox+Cdep) is referred to as the modulation factor. The modulation factor is less than 1. For example, the modulation factor is equal to or greater than 0.5 and less than or equal to 0.8. Because the modulation factor is less than 1, change in the potential of the first portion FD3 is suppressed. This contributes to an expansion of the dynamic range.

In the first embodiment, when the first following transistor M17 is in the on state, the first portion FD3 and the first charge storage FD1 are electrically connected through the first following transistor M17. Because the above configuration is adopted, the dynamic range expansion effect originating from the modulation factor of the first interposing transistor M16 is canceled. The effect is canceled because even if a charge is injected from the first portion FD3 into the first charge storage FD1, the total quantity of charge stored in the first portion FD3 and the first charge storage FD1 is unchanged. On the other hand, as described above, according to the first embodiment, the imaging device 100 can be configured simply.

Third Embodiment

Figure 15:
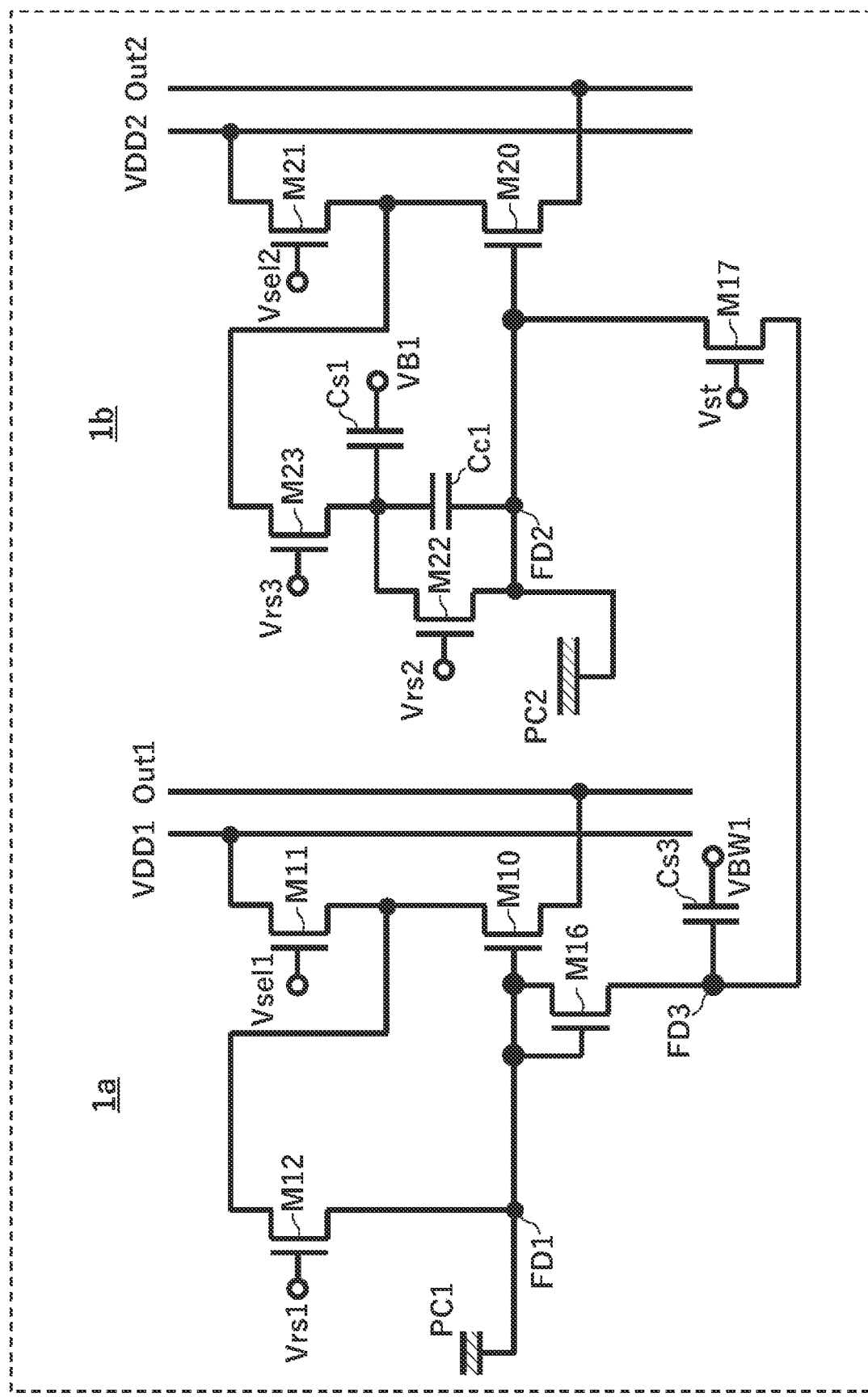
FIG. 15 is a schematic diagram illustrating a circuit configuration of a pixel of an imaging device according to a third embodiment.

FIG. 15 illustrates a circuit configuration of a pixel 1 of an imaging device 100 according to a third embodiment.

In the first embodiment, the third pixel signal $V_{FD3}$ is outputted from the first imaging cell 1a. In contrast, in the third embodiment, the third pixel signal $V_{FD3}$ is outputted from the second imaging cell 1b. Specifically, in the third embodiment, the first capacitor Cs3 may be electrically connected to the second charge storage FD2.

In the third embodiment, the first charge storage FD1 is electrically connected to the gate electrode of the first amplification transistor M10. The second charge storage FD2 is electrically connected to the gate electrode of the second amplification transistor M20. By turning on the first following transistor M17, the first capacitor Cs3, one of the source or drain of the first following transistor M17, the other of the source or drain of the first following transistor M17, and the gate electrode of the second amplification transistor M20 are electrically connected in the above order.

In the third embodiment, in the state with the second select transistor M21 and the first following transistor M17 turned on, the third pixel signal $V_{FD3}$ corresponding to the potential of the first capacitor Cs3 is outputted to the second peripheral circuit through the first following transistor M17, the second amplification transistor M20, and the second signal line Out2 in the above order.

In the third embodiment, in the state with the second select transistor M21 and the first following transistor M17 turned on, the bandwidth control transistor M23 and the second reset transistor M22 are turned on. This arrangement resets the potential of the second charge storage FD2 and resets the potential of the first capacitor Cs3, that is, the potential of the first portion FD3. In addition, a reset signal corresponding to the potential of the first portion FD3 is outputted to the second peripheral circuit through the first following transistor M17, the second amplification transistor M20, and the second signal line Out2 in the above order. By subtracting the reset signal from the third pixel signal $V_{FD3}$, noise in the third pixel signal $V_{FD3}$ is reduced.

According to the third embodiment, the number of transistors can be reduced compared to the second embodiment.

Fourth Embodiment

Figure 16:
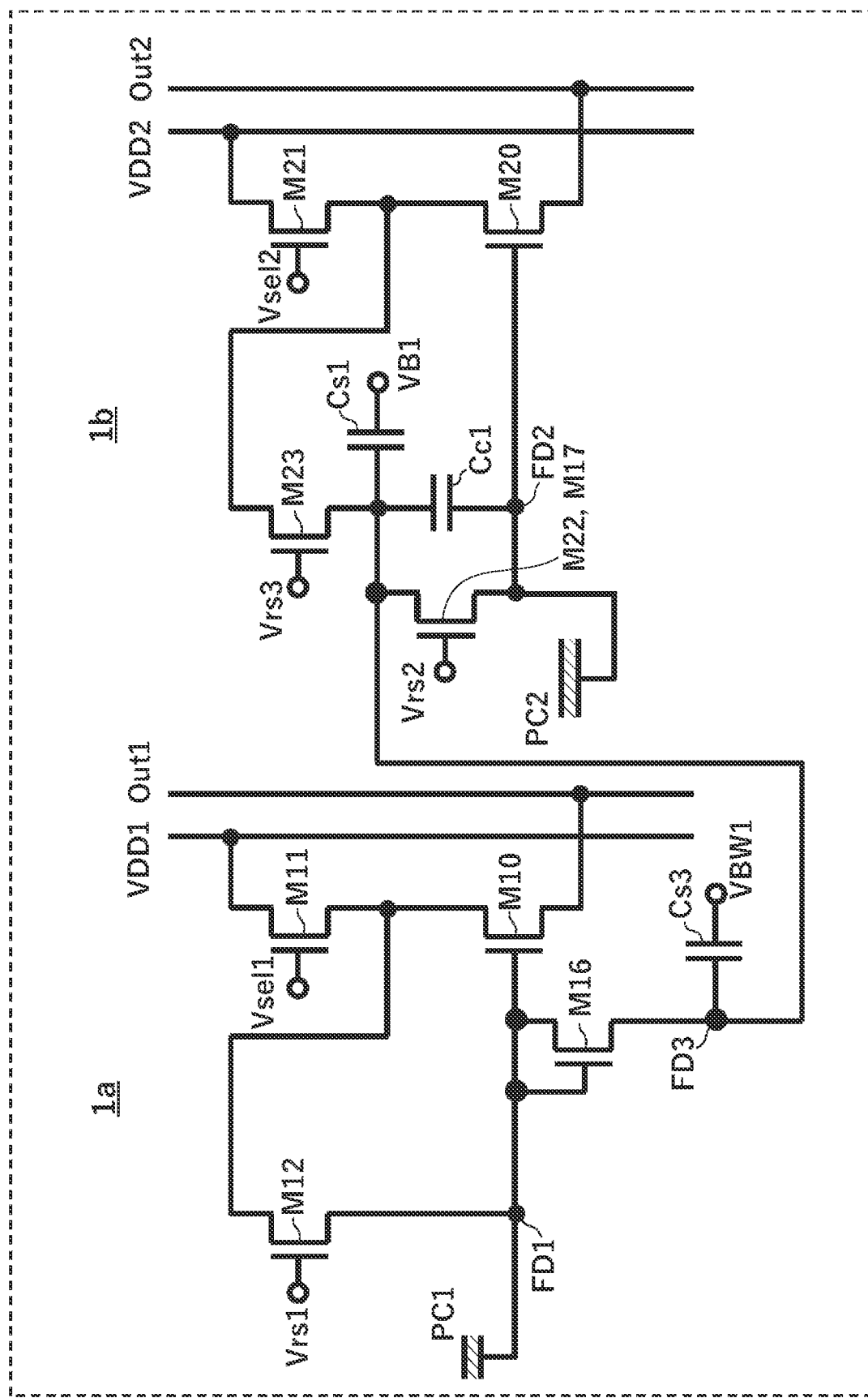
FIG. 16 is a schematic diagram illustrating a circuit configuration of a pixel of an imaging device according to a fourth embodiment.

FIG. 16 illustrates a circuit configuration of a pixel 1 of an imaging device 100 according to a fourth embodiment.

In the fourth embodiment, the first capacitor Cs3 is electrically connected to the capacitor Cs1. Hereinafter, the capacitor Cs1 may also be referred to as the specific capacitor Cs1. Specifically, the first portion FD3 is electrically connected to the specific capacitor Cs1.

In the fourth embodiment, the first capacitor Cs3 cooperates with the specific capacitor Cs1 to form a combined capacitor. Additionally, by turning on the first interposing transistor M16, the first charge storage FD1 and the combined capacitor are electrically connected.

In the fourth embodiment, like the third embodiment, the first charge storage FD1 is electrically connected to the gate electrode of the first amplification transistor M10. The second charge storage FD2 is electrically connected to the gate electrode of the second amplification transistor M20. By turning on the first following transistor M17, the first capacitor Cs3, one of the source or drain of the first following transistor M17, the other of the source or drain of the first following transistor M17, and the gate electrode of the second amplification transistor M20 are electrically connected in the above order. In the fourth embodiment, the second reset transistor M22 is used as the first following transistor M17.

Also, in the fourth embodiment, turning on the first following transistor M17, that is, the second reset transistor M22, causes the specific capacitor Cs1, one of the source or drain of the first following transistor M17, the other of the source or drain of the first following transistor M17, and the gate electrode of the second amplification transistor M20 to be electrically connected in the above order.

The following can be said of the fourth embodiment using the term "combined capacitor". Namely, by turning on the first following transistor M17, the combined capacitor, one of the source or drain of the first following transistor M17, the other of the source or drain of the first following transistor M17, and the gate electrode of the second amplification transistor M20 are electrically connected in the above order.

In the fourth embodiment, in the state with the second select transistor M21 and the first following transistor M17 turned on, the third pixel signal $V_{FD3}$ corresponding to the potential of the combined capacitor is outputted to the second peripheral circuit through the first following transistor M17, the second amplification transistor M20, and the second signal line Out2 in the above order.

In the fourth embodiment, in the state with the second select transistor M21 turned on, the bandwidth control transistor M23 is turned on. This arrangement resets the potential of the combined capacitor. In addition, a reset signal corresponding to the potential of the combined capacitor is outputted to the second peripheral circuit through the first following transistor M17, the second amplification transistor M20, and the second signal line Out2 in the above order. By subtracting the reset signal from the third pixel signal $V_{FD3}$, noise in the third pixel signal $V_{FD3}$ is reduced.

In the fourth embodiment, the first capacitor Cs3 cooperates with the specific capacitor Cs1 to form the combined capacitor. This is suitable for achieving an imaging device 100 with high saturation and a wide dynamic range.

Fifth Embodiment

Figure 17:
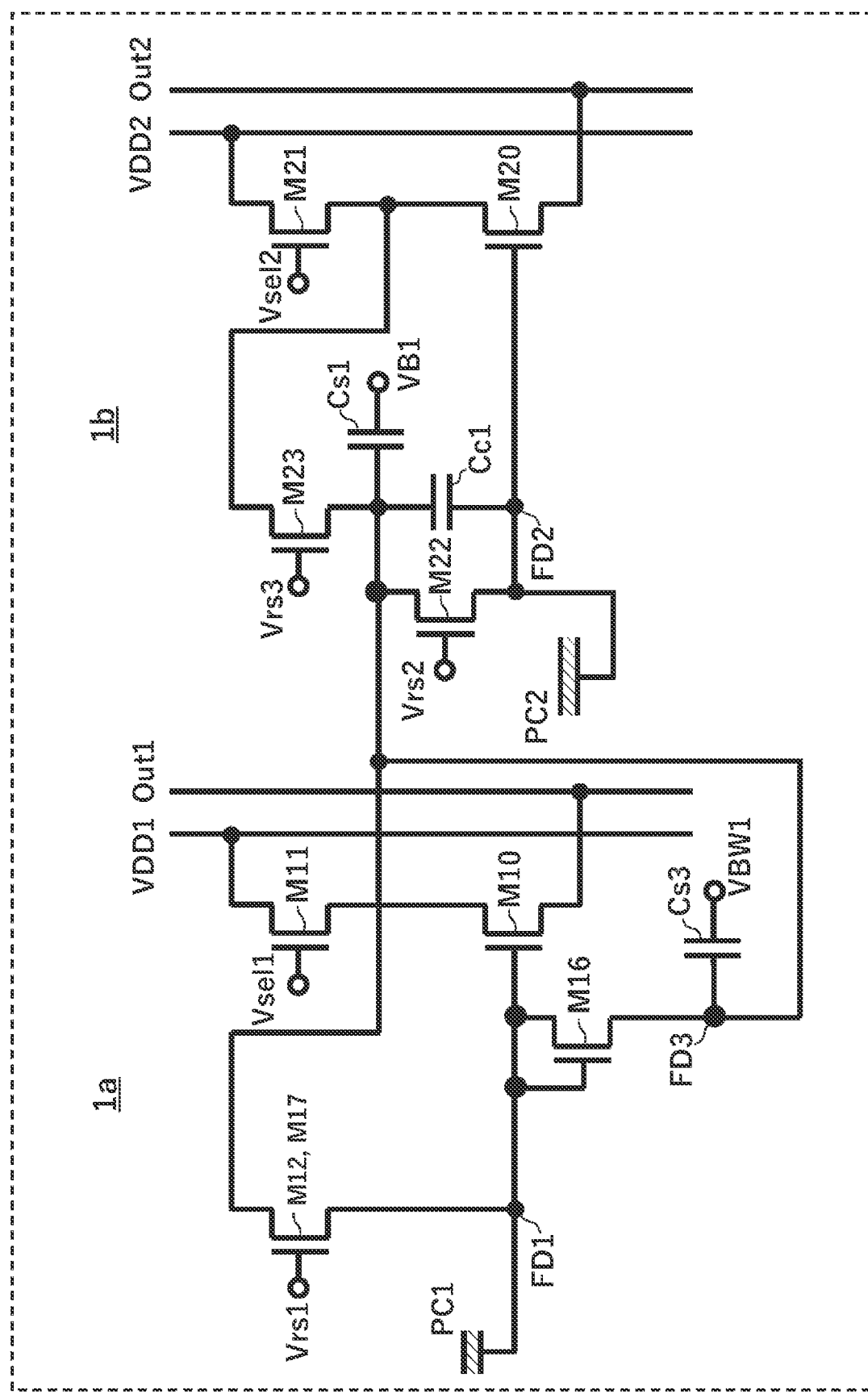
FIG. 17 is a schematic diagram illustrating a circuit configuration of a pixel of an imaging device according to a fifth embodiment.

FIG. 17 illustrates a circuit configuration of a pixel 1 of an imaging device 100 according to a fifth embodiment.

In the fifth embodiment, like the fourth embodiment, the first capacitor Cs3 is electrically connected to the specific capacitor Cs1. Specifically, the first portion FD3 is electrically connected to the capacitor Cs1. The first capacitor Cs3 cooperates with the specific capacitor Cs1 to form a combined capacitor.

However, in the fifth embodiment, the third pixel signal $V_{FD3}$ is outputted in a different way than the fourth embodiment. Specifically, in the fourth embodiment, the third pixel signal $V_{FD3}$ is outputted from the second imaging cell 1b. In contrast, in the fifth embodiment, the third pixel signal $V_{FD3}$ is outputted from the first imaging cell 1a.

In the fifth embodiment, the combined capacitor is electrically connected to one of the source or drain of the first following transistor M17. The other of the source or drain of the first following transistor M17 is electrically connected to the first charge storage FD1. In the fifth embodiment, the first reset transistor M12 is used as the first following transistor M17.

In the fifth embodiment, the first charge storage FD1 is electrically connected to the gate electrode of the first amplification transistor M10. By turning on the first following transistor M17, the first capacitor Cs3, one of the source or drain of the first following transistor M17, the other of the source or drain of the first following transistor M17, and the gate electrode of the first amplification transistor M10 are electrically connected in the above order.

Also, in the fifth embodiment, turning on the first following transistor M17 causes the specific capacitor Cs1, one of the source or drain of the first following transistor M17, the other of the source or drain of the first following transistor M17, and the gate electrode of the first amplification transistor M10 to be electrically connected in the above order.

The following can be said of the fifth embodiment using the term "combined capacitor". Namely, by turning on the first following transistor M17, the combined capacitor, one of the source or drain of the first following transistor M17, the other of the source or drain of the first following transistor M17, and the gate electrode of the first amplification transistor M10 are electrically connected in the above order.

In the fifth embodiment, in the state with the first select transistor M11 and the first following transistor M17 turned on, the third pixel signal $V_{FD3}$ corresponding to the potential of the combined capacitor is outputted to the first peripheral circuit through the first following transistor M17, the first amplification transistor M10, and the first signal line Out1 in the above order.

In the fifth embodiment, in the state with the second select transistor M21 turned on, the bandwidth control transistor M23 is turned on. This arrangement resets the potential of the combined capacitor. In addition, a reset signal corresponding to the potential of the combined capacitor is outputted to the first peripheral circuit through the first following transistor M17, the first amplification transistor M10, and the first signal line Out1 in the above order. By subtracting the reset signal from the third pixel signal $V_{FD3}$, noise in the third pixel signal $V_{FD3}$ is reduced.

In the fifth embodiment, a discontinuity occurs less readily compared to the third and fourth embodiments. Hereinafter, this point will be described.

In the graph of FIG. 6 relating to the first embodiment, not only the line representing the second pixel signal $V_{FD2}$ and the line representing the first pixel signal $V_{FD1}$ but also the line representing the third pixel signal $V_{FD3}$ pass through the origin. Accordingly, it is easy to create a continuous single line out of the three lines in software.

On the other hand, in the third and fourth embodiments, the line representing the third pixel signal $V_{FD3}$ does not pass through the origin, but rises from a position where the light intensity is higher. This is because even though the first pixel signal $V_{FD1}$ and the third pixel signal $V_{FD3}$ are generated by a single shared imaging cell, namely the first imaging cell 1a, the first pixel signal $V_{FD1}$ and the third pixel signal $V_{FD3}$ are outputted via mutually different amplification transistors. Specifically, the first pixel signal $V_{FD1}$ is outputted via the first amplification transistor M10. On the other hand, the third pixel signal $V_{FD3}$ is outputted via the second amplification transistor M20.

If the line representing the third pixel signal $V_{FD3}$ does not pass through the origin, it is difficult to create a continuous single line out of the line representing the second pixel signal $V_{FD2}$, the line representing the first pixel signal $V_{FD1}$, and the line representing the third pixel signal $V_{FD3}$ in software. Specifically, in the created, single line, the seam between the portion based on the third pixel signal $V_{FD3}$ and the portion based on the first pixel signal $V_{FD1}$ is easily discontinuous. A discontinuity refers to the phenomenon whereby such a discontinuous seam portion occurs.

In contrast, in the fifth embodiment, both the first pixel signal $V_{FD1}$ and the third pixel signal $V_{FD3}$ are outputted via the first amplification transistor M10. Accordingly, not only the line representing the second pixel signal $V_{FD2}$ and the line representing the first pixel signal $V_{FD1}$ but also the line representing the third pixel signal $V_{FD3}$ pass through the origin. Therefore, according to the fifth embodiment, a discontinuity occurs less readily.

Sixth Embodiment

Figure 18:
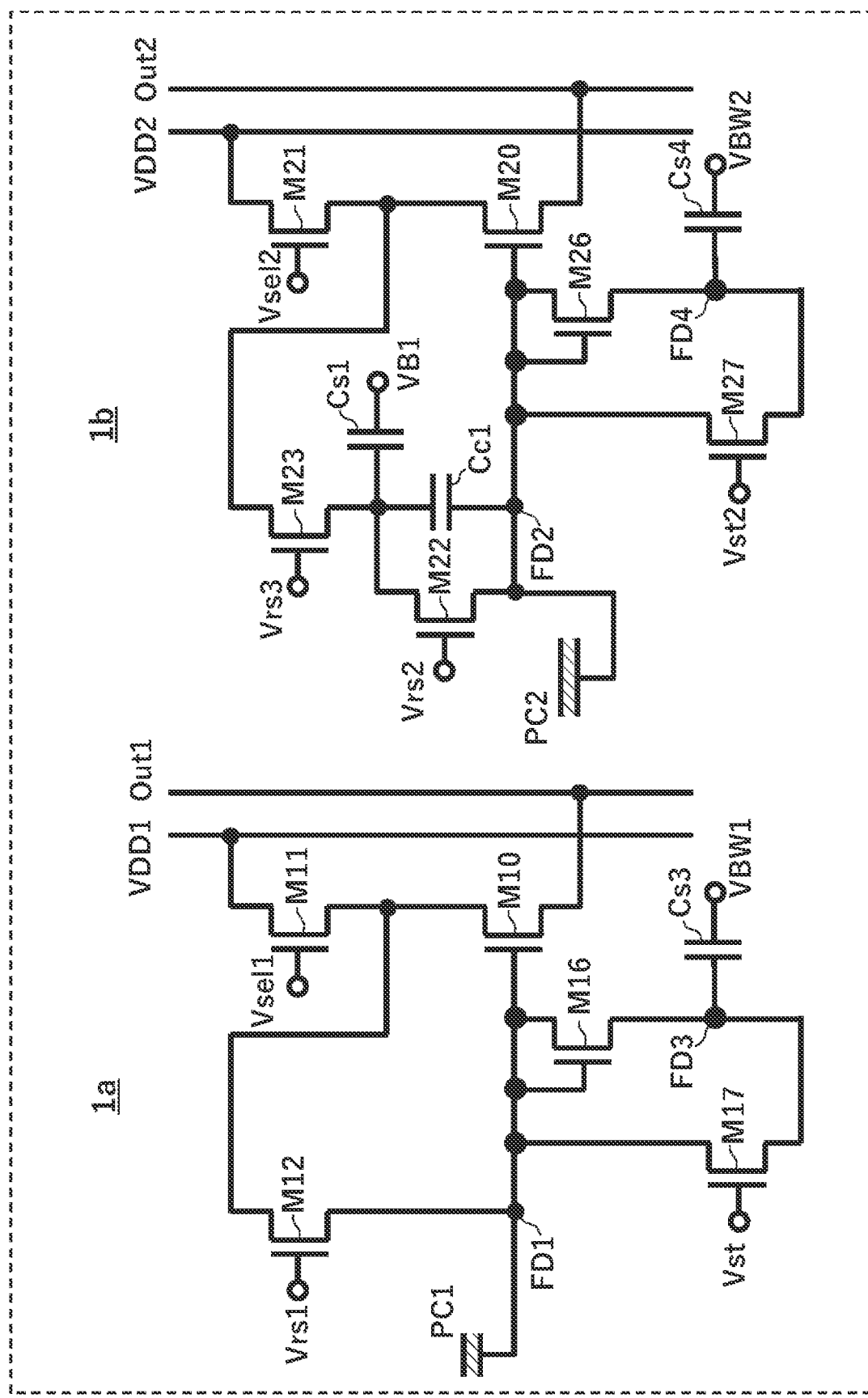
FIG. 18 is a schematic diagram illustrating a circuit configuration of a pixel of an imaging device according to a sixth embodiment.

FIG. 18 illustrates a circuit configuration of a pixel 1 of an imaging device 100 according to a sixth embodiment.

The imaging device 100 according to the sixth embodiment is provided with a second capacitor Cs4, a second interposing transistor M26, and a second following transistor M27. The second interposing transistor M26 may also be referred to as the second charge injection transistor. Specifically, the second interposing transistor M26 may also be referred to as the second electron injection transistor. The second following transistor M27 may also be referred to as the second short transistor.

Specifically, in the sixth embodiment, the second imaging cell 1b is provided with the second capacitor Cs4, the second interposing transistor M26, and the second following transistor M27. More specifically, the second signal processing circuit P2 is provided with the second capacitor Cs4, the second interposing transistor M26, and the second following transistor M27.

In the following example, a positive charge is used as the signal charge. Specifically, positive holes are used as the signal charge. Also, the transistors M10, M11, M12, M16, M17, M20, M21, M22, M23, M26, and M27 are n-type transistors. Specifically, the transistors are n-type MOSFETs.

However, a negative charge may also be used as the signal charge. Specifically, electrons may be used as the signal charge. In this case, p-type transistors can be used as the transistors M10, M11, M12, M16, M17, M20, M21, M22, M23, M26, and M27. Specifically, in this case, p-type MOSFETs can be used as the transistors.

In the present embodiment, the gate electrode of the second interposing transistor M26 and one of the source or drain of the second interposing transistor M26 are electrically connected to the second charge storage FD2. By turning on the second interposing transistor M26, the second charge storage FD2 and the second capacitor Cs4 are electrically connected through the second interposing transistor M26.

In the present embodiment, by turning on the second following transistor M27, the second capacitor Cs4, one of the source or drain of the second following transistor M27, and the other of the source or drain of the second following transistor M27 are electrically connected in the above order.

In the present embodiment, the other of the source or drain of the second interposing transistor M26 and the second capacitor Cs4 are electrically connected. One of the source or drain of the second following transistor M27 is electrically connected to the second capacitor Cs4. The other of the source or drain of the second following transistor M27 is electrically connected to the second charge storage FD2.

In the present embodiment, the first charge storage FD1 is electrically connected to the gate electrode of the first amplification transistor M10. The second charge storage FD2 is electrically connected to the gate electrode of the second amplification transistor M20. By turning on the first following transistor M17, the first capacitor Cs3, one of the source or drain of the first following transistor M17, the other of the source or drain of the first following transistor M17, and the gate electrode of the first amplification transistor M10 are electrically connected in the above order.

In the present embodiment, turning on the second following transistor M27 causes the second capacitor Cs4, one of the source or drain of the second following transistor M27, the other of the source or drain of the second following transistor M27, and the gate electrode of the second amplification transistor M20 to be electrically connected in the above order.

In the present embodiment, the capacitance value of the second capacitor Cs4 is greater than the capacitance value of the second charge storage FD2. A ratio c4/c2 is equal to or greater than 3, for example, where c2 is the capacitance value of the second charge storage FD2 and c4 is the capacitance value of the second capacitor Cs4. The ratio c4/c2 may also be equal to or greater than 6, and may also be equal to or greater than 10. The ratio c4/c2 may be less than or equal to 1000, for example. The ratio c4/c2 may also be less than or equal to 100, and may also be less than or equal to 50.

In the present embodiment, the second capacitor Cs4 has an MIM structure.

In the present embodiment, by turning on the second interposing transistor M26, the second charge storage FD2 is electrically connected to one end of the second capacitor Cs4 through the second interposing transistor M26. A DC potential VBW2 is applied to the other end of the second capacitor Cs4. The DC potential VBW2 may be the ground potential or a potential biased from the ground potential.

Hereinafter, the portion of the second capacitor Cs4 that is electrically connected to the second interposing transistor M26 may also be referred to as the second portion FD4.

In the present embodiment, the conductivity type of the gate electrode of the second interposing transistor M26 is the opposite of the conductivity type of the source and the drain of the second interposing transistor M26. Specifically, in the present embodiment, the gate electrode of the second interposing transistor M26 is of p-type conductivity. The source and the drain of the second interposing transistor M26 are of n-type conductivity. The gate electrode of the second interposing transistor M26 is a polysilicon electrode, for example.

The gate length of the second interposing transistor M26 may be longer than the gate length of the second following transistor M27. The gate length of the second interposing transistor M26 may be the same as the gate length of the second following transistor M27. The gate length of the second interposing transistor M26 may be shorter than the gate length of the second following transistor M27.

The gate width of the second interposing transistor M26 may be longer than the gate width of the second following transistor M27. The gate width of the second interposing transistor M26 may be the same as the gate width of the second following transistor M27. The gate width of the second interposing transistor M26 may be shorter than the gate width of the second following transistor M27.

The gate thickness of the second interposing transistor M26 may be greater than the gate thickness of the second following transistor M27. The gate thickness of the second interposing transistor M26 may be the same as the gate thickness of the second following transistor M27. The gate thickness of the second interposing transistor M26 may be less than the gate thickness of the second following transistor M27.

Hereinafter, the voltage of the gate electrode of the second following transistor M27 is designated the voltage Vst2. In the present embodiment, the voltage Vst2 is changed from the low level to the high level, turning on the second following transistor M27. With this arrangement, the second charge storage FD2 and the second portion FD4 are electrically connected through the second following transistor M27. Thereafter, an electrical signal corresponding to the potential of the second charge storage FD2 and the potential of the second portion FD4 is outputted to the second peripheral circuit through the second amplification transistor M20 and the second signal line Out2 in the above order. The level of the electrical signal rises continuously as the intensity of the light incident on the imaging device 100 increases.

The electrical signal will be described further. In the present embodiment, the capacitance value of the second capacitor Cs4 is greater than the capacitance value of the second charge storage FD2. For this reason, the electrical signal corresponding to a second combined potential, in which the potential of the second capacitor Cs4 is reflected more strongly than the potential of the second charge storage FD2, is outputted to the second peripheral circuit through the second amplification transistor M20 and the second signal line Out2 in the above order.

In the present embodiment, the above electrical signal may be referred to as the pixel signal of the second portion FD4 or the fourth pixel signal $V_{FD4}$.

After the fourth pixel signal $V_{FD4}$ is outputted, the voltages Vrs2 and Vrs3 are changed from the low level to the high level, turning on the second reset transistor M22 and the bandwidth control transistor M23. This arrangement resets the potential of the second charge storage FD2 and resets the potential of the second capacitor Cs4, that is, the potential of the second portion FD4.

Thereafter, an electrical signal corresponding to the potential of the second charge storage FD2 and the potential of the second portion FD4 is outputted to the second peripheral circuit through the second amplification transistor M20 and the second signal line Out2 in the above order. The electrical signal is a reset signal related to the second combined potential. In the present embodiment, the reset signal related to the second combined potential may be referred to as the reset signal of the second portion FD4.

Thereafter, the reset signal of the second portion FD4 is subtracted from the fourth pixel signal $V_{FD4}$ of the second portion FD4. With this arrangement, noise in the fourth pixel signal $V_{FD4}$ is reduced.

In the present embodiment, a signal corresponding to the potential of the second capacitor Cs4 is read out, after which a signal corresponding to the potential of the second charge storage FD2 is read out. In the above example, the signal corresponding to the potential of the second capacitor Cs4 is the fourth pixel signal $V_{FD4}$. The signal corresponding to the potential of the second charge storage FD2 is the second pixel signal $V_{FD2}$.

If the intensity of the light incident on the imaging device 100 increases from a low level, the signal charge stored in the second charge storage FD2 increases. In the present embodiment, the signal charge is a positive charge. If the signal charge increases, the potential of the second charge storage FD2 rises. If the potential of the second charge storage FD2 exceeds a second threshold potential, the second interposing transistor M26 turns on, and the second charge storage FD2 and the second portion FD4 are electrically connected through the second interposing transistor M26. If the light intensity increases further and the potential of the second charge storage FD2 rises further, the gate potential of the second interposing transistor M26 rises. This causes the gate potential of the second interposing transistor M26 to rise above the potential of the second portion FD4. At this stage, the potential of the second charge storage FD2 is higher than the potential of the second portion FD4, similarly to when the light intensity is at a low level. A negative charge is injected from the second portion FD4 into the second charge storage FD2 through the second interposing transistor M26. Specifically, the negative charge is electrons. The injection of the negative charge causes the potential of the second charge storage FD2 to fall. Accordingly, the gate potential of the second interposing transistor M26 also falls. On the other hand, the potential of the second portion FD4 rises.

In the present embodiment, the potential of the second charge storage FD2 and the potential of the second portion FD4 are balanced by such injection of the negative charge. In conditions in which the intensity of the light incident on the imaging device 100 increases, the potential of the second charge storage FD2 and the potential of the second portion FD4 may rise while remaining balanced.

A similar phenomenon also occurs in the case where the signal charge is a negative charge.

The following technical features are derived from the above description. Namely, an increase in one of either a positive or a negative charge generated by photoelectric conversion in the second photoelectric converter PC2 causes an increase in one of either a positive or a negative charge stored in the second charge storage FD2. An increase in one of either a positive or a negative charge stored in the second charge storage FD2 causes the potential of the second charge storage FD2 to do one of either rise or fall. Either a rise or a fall in the potential of the second charge storage FD2 causes a third phenomenon and a fourth phenomenon to appear, in that order. The third phenomenon is the turning on of the second interposing transistor M26. The fourth phenomenon is the supplying of the other of either a positive or a negative charge from the second capacitor Cs4 to the second charge storage FD2 through the second interposing transistor M26. The supplying causes the potential of the second charge storage FD2 to do the other of either rise or fall.

As illustrated in FIG. 6, in the first embodiment, the three lines of the line representing the second pixel signal $V_{FD2}$, the line representing the first pixel signal $V_{FD1}$, and the line representing the third pixel signal $V_{FD3}$ are obtained. As illustrated in FIG. 7, in the first embodiment, the three lines of the line representing the second SNR $SN_{FD2}$, the line representing the first SNR $SN_{FD1}$, and the line representing the third SNR $SN_{FD3}$ are obtained.

According to the sixth embodiment, a line representing the fourth pixel signal $V_{FD4}$ is further obtained between the line representing the second pixel signal $V_{FD2}$ and the line representing the first pixel signal $V_{FD1}$. In addition, a line representing the SNR related to the fourth pixel signal $V_{FD4}$ is further obtained between the line representing the second SNR $SN_{FD2}$ and the line representing the first SNR $SN_{FD1}$. This line may mitigate the decrease in the seam SNR. Consequently, the light intensity range with a high SNR can be widened.

Seventh Embodiment

Figure 19:
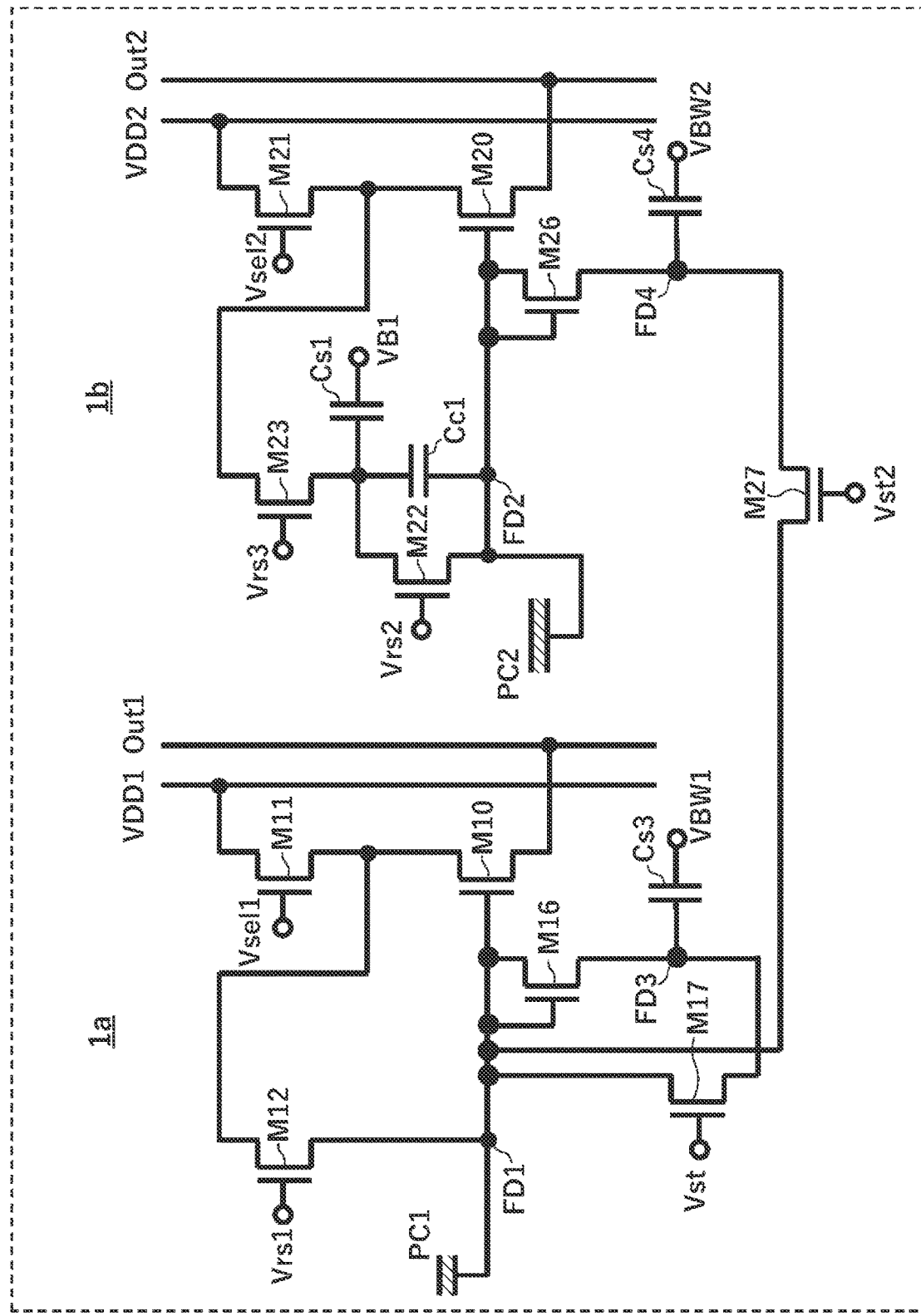
FIG. 19 is a schematic diagram illustrating a circuit configuration of a pixel of an imaging device according to a seventh embodiment.

FIG. 19 illustrates a circuit configuration of a pixel 1 of an imaging device 100 according to a seventh embodiment.

In the seventh embodiment, one of the source or drain of the second following transistor M27 is electrically connected to the second capacitor Cs4. The other of the source or drain of the second following transistor M27 is electrically connected to the first charge storage FD1.

In the seventh embodiment, turning on the second following transistor M27 causes the second capacitor Cs4, one of the source or drain of the second following transistor M27, the other of the source or drain of the second following transistor M27, and the gate electrode of the first amplification transistor M10 to be electrically connected in the above order.

In the sixth embodiment, turning on the second following transistor M27 causes the second capacitor Cs4 and the second charge storage FD2 to be electrically connected. This electrical connection may lower the gain of the second imaging cell 1b. On the other hand, in the seventh embodiment, turning on the second following transistor M27 causes the second capacitor Cs4 and the first charge storage FD1 to be electrically connected. This electrical connection may lower the gain of the first imaging cell 1a.

In the sixth and seventh embodiments, the first imaging cell 1a is a low-sensitivity cell and the second imaging cell 1b is a high-sensitivity cell. According to the seventh embodiment, the gain of the high-sensitivity cell is easily secured. This is advantageous from the standpoint of lowering the overall noise level of the imaging device 100.

Eighth Embodiment

Figure 20:
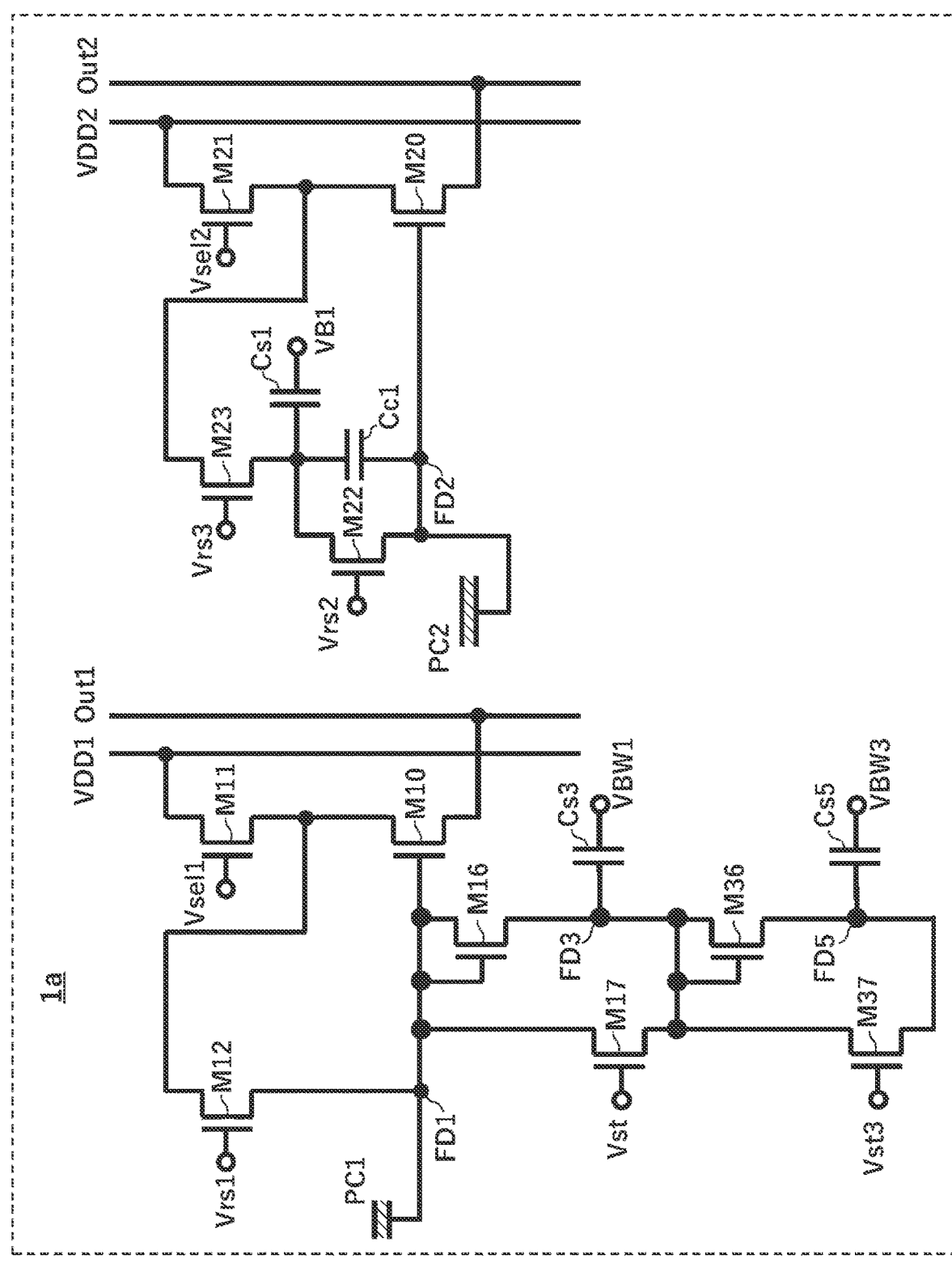
FIG. 20 is a schematic diagram illustrating a circuit configuration of a pixel of an imaging device according to an eighth embodiment.

FIG. 20 illustrates a circuit configuration of a pixel 1 of an imaging device 100 according to an eighth embodiment.

The imaging device 100 according to the eighth embodiment is provided with an additional capacitor Cs5, an additional interposing transistor M36, and an additional following transistor M37. The additional interposing transistor M36 may also be referred to as the additional charge injection transistor. Specifically, the additional interposing transistor M36 may also be referred to as the additional electron injection transistor. The additional following transistor M37 may also be referred to as the additional short transistor.

Specifically, in the eighth embodiment, the first imaging cell 1a is provided with the additional capacitor Cs5, the additional interposing transistor M36, and the additional following transistor M37. More specifically, the first signal processing circuit P1 is provided with the additional capacitor Cs5, the additional interposing transistor M36, and the additional following transistor M37.

The gate electrode of the additional interposing transistor M36 and one of the source or drain of the additional interposing transistor M36 are electrically connected to the first capacitor Cs3. By turning on the additional interposing transistor M36, the first capacitor Cs3 and the additional capacitor Cs5 are electrically connected through the additional interposing transistor M36.

In the present embodiment, by turning on the additional following transistor M37, the additional capacitor Cs5, one of the source or drain of the additional following transistor M37, and the other of the source or drain of the additional following transistor M37 are electrically connected in the above order.

In the present embodiment, the other of the source or drain of the additional interposing transistor M36 and the additional capacitor Cs5 are electrically connected. One of the source or drain of the additional following transistor M37 is electrically connected to the additional capacitor Cs5.

In the present embodiment, one of the source or drain of the first following transistor M17, the other of the source or drain of the additional following transistor M37, the first capacitor Cs3, the gate electrode of the additional interposing transistor M36, and one of the source or drain of the additional interposing transistor M36 are electrically connected. The other of the source or drain of the first following transistor M17 is electrically connected to the first charge storage FD1.

In the present embodiment, the first charge storage FD1 is electrically connected to the gate electrode of the first amplification transistor M10. By turning on the first following transistor M17 and the additional following transistor M37, the additional capacitor Cs5, one of the source or drain of the additional following transistor M37, the other of the source or drain of the additional following transistor M37, one of the source or drain of the first following transistor M17, the other of the source or drain of the first following transistor M17, and the gate electrode of the first amplification transistor M10 are electrically connected in the above order.

In the present embodiment, the capacitance value of the additional capacitor Cs5 is greater than the capacitance value of the first charge storage FD1. A ratio c5/c1 is equal to or greater than 3, for example, where c1 is the capacitance value of the first charge storage FD1 and c5 is the capacitance value of the additional capacitor Cs5. The ratio c5/c1 may also be equal to or greater than 6, and may also be equal to or greater than 10. The ratio c5/c1 may be less than or equal to 1000, for example. The ratio c5/c1 may also be less than or equal to 100, and may also be less than or equal to 50.

In the present embodiment, the capacitance value c5 of the additional capacitor Cs5 is smaller than the capacitance value c3 of the first capacitor Cs3. However, the capacitance value c5 may also be the same as the capacitance value c3. The capacitance value c5 may also be larger than the capacitance value c3.

In the present embodiment, the additional capacitor Cs5 has an MIM structure.

In the present embodiment, by turning on the additional interposing transistor M36, one end of the first capacitor Cs3 is electrically connected to one end of the additional capacitor Cs5 through the additional interposing transistor M36. A DC potential VBW3 is applied to the other end of the additional capacitor Cs5. The DC potential VBW3 may be the ground potential or a potential biased from the ground potential.

Hereinafter, the portion of the additional capacitor Cs5 that is electrically connected to the additional interposing transistor M36 may also be referred to as the additional portion FD5.

In the present embodiment, the conductivity type of the gate electrode of the additional interposing transistor M36 is the opposite of the conductivity type of the source and the drain of the additional interposing transistor M36. Specifically, in the present embodiment, the gate electrode of the additional interposing transistor M36 is of p-type conductivity. The source and the drain of the additional interposing transistor M36 are of n-type conductivity. The gate electrode of the additional interposing transistor M36 is a polysilicon electrode, for example.

The gate length of the additional interposing transistor M36 may be longer than the gate length of the additional following transistor M37. The gate length of the additional interposing transistor M36 may be the same as the gate length of the additional following transistor M37. The gate length of the additional interposing transistor M36 may be shorter than the gate length of the additional following transistor M37.

The gate width of the additional interposing transistor M36 may be longer than the gate width of the additional following transistor M37. The gate width of the additional interposing transistor M36 may be the same as the gate width of the additional following transistor M37. The gate width of the additional interposing transistor M36 may be shorter than the gate width of the additional following transistor M37.

The gate thickness of the additional interposing transistor M36 may be greater than the gate thickness of the additional following transistor M37. The gate thickness of the additional interposing transistor M36 may be the same as the gate thickness of the additional following transistor M37. The gate thickness of the additional interposing transistor M36 may be less than the gate thickness of the additional following transistor M37.

Hereinafter, the voltage of the gate electrode of the additional following transistor M37 is designated the voltage Vst3. In the present embodiment, the voltages Vst and Vst3 are changed from the low level to the high level, turning on the first following transistor M17 and the additional following transistor M37. With this arrangement, the first charge storage FD1, the first portion FD3, and the additional portion FD5 are electrically connected. Thereafter, an electrical signal corresponding to the potential of the first charge storage FD1, the potential of the first portion FD3, and the potential of the additional portion FD5 is outputted to the first peripheral circuit through the first amplification transistor M10 and the first signal line Out1 in the above order. The level of the electrical signal rises continuously as the intensity of the light incident on the imaging device 100 increases.

The electrical signal will be described further. In the present embodiment, the capacitance value of the first capacitor Cs3 is greater than the capacitance value of the first charge storage FD1. Also, the capacitance value of the additional capacitor Cs5 is greater than the capacitance value of the first charge storage FD1. For this reason, the electrical signal corresponding to a third combined potential, in which the potential of the first capacitor Cs3 is reflected more strongly than the potential of the first charge storage FD1 and in which the potential of the additional capacitor Cs5 is reflected more strongly than the potential of the first charge storage FD1, is outputted to the first peripheral circuit through the first amplification transistor M10 and the first signal line Out1 in the above order.

In the present embodiment, the above electrical signal may be referred to as the pixel signal of the additional portion FD5 or the fifth pixel signal $V_{FD5}$.

After the fifth pixel signal $V_{FD5}$ is outputted, the voltage Vrs1 is changed from the low level to the high level, turning on the first reset transistor M12. This arrangement resets the potential of the first charge storage FD1, resets the potential of the first capacitor Cs3, that is, the potential of the first portion FD3, and resets the potential of the additional capacitor Cs5, that is, the potential of the additional portion FD5.

Thereafter, an electrical signal corresponding to the potential of the first charge storage FD1, the potential of the first portion FD3, and the potential of the additional portion FD5 is outputted to the first peripheral circuit through the first amplification transistor M10 and the first signal line Out1 in the above order. The electrical signal is a reset signal related to the third combined potential. In the present embodiment, the reset signal related to the third combined potential may be referred to as the reset signal of the additional portion FD5.

Thereafter, the reset signal of the additional portion FD5 is subtracted from the fifth pixel signal $V_{FD5}$ of the additional portion FD5. With this arrangement, noise in the fifth pixel signal $V_{FD5}$ is reduced.

If the intensity of the light incident on the imaging device 100 increases from a low level, the signal charge stored in the first charge storage FD1 increases. In the present embodiment, the signal charge is a positive charge. If the signal charge increases, the potential of the first charge storage FD1 rises. If the potential of the first charge storage FD1 exceeds a first threshold potential, the first interposing transistor M16 turns on, and the first charge storage FD1 and the first portion FD3 are electrically connected through the first interposing transistor M16. If the light intensity increases further and the potential of the first charge storage FD1 rises further, the gate potential of the first interposing transistor M16 rises. This causes the gate potential of the first interposing transistor M16 to rise above the potential of the first portion FD3. At this stage, the potential of the first charge storage FD1 is higher than the potential of the first portion FD3, similarly to when the light intensity is at a low level. A negative charge is injected from the first portion FD3 into the first charge storage FD1 through the first interposing transistor M16. Specifically, the negative charge is electrons. The injection of the negative charge causes the potential of the first charge storage FD1 to fall. Accordingly, the gate potential of the first interposing transistor M16 also falls. On the other hand, the potential of the first portion FD3 rises.

If the potential of the first portion FD3 exceeds a third threshold potential, the additional interposing transistor M36 turns on, and the first portion FD3 and the additional portion FD5 are electrically connected through the additional interposing transistor M36. If the potential of the first portion FD3 rises further, the gate potential of the additional interposing transistor M36 rises. This causes the gate potential of the additional interposing transistor M36 to rise above the potential of the additional portion FD5. At this stage, the potential of the first portion FD3 is higher than the potential of the additional portion FD5. A negative charge is injected from the additional portion FD5 into the first portion FD3 through the additional interposing transistor M36. Specifically, the negative charge is electrons. The injection of the negative charge causes the potential of the first portion FD3 to fall. Accordingly, the gate potential of the additional interposing transistor M36 also falls. On the other hand, the potential of the additional portion FD5 rises.

In the present embodiment, the potential of the first charge storage FD1, the potential of the first portion FD3, and the potential of the additional portion FD5 are balanced by such injection of the negative charge. In conditions in which the intensity of the light incident on the imaging device 100 increases, the potential of the first charge storage FD1, the potential of the first portion FD3, and the potential of the additional portion FD5 may rise while remaining balanced.

A similar phenomenon also occurs in the case where the signal charge is a negative charge.

The following technical features are derived from the above description. Namely, either a rise or a fall in the potential of the first portion FD3 of the first capacitor Cs3 causes a fifth phenomenon and a sixth phenomenon to appear, in that order. The fifth phenomenon is the turning on of the additional interposing transistor M36. The sixth phenomenon is the supplying of a positive or negative charge from the additional capacitor Cs5 to the first capacitor Cs3 through the additional interposing transistor M36. The supplying causes the potential of the first portion FD3 of the first capacitor Cs3 to do the other of either rise or fall.

As illustrated in FIG. 6, in the first embodiment, the three lines of the line representing the second pixel signal $V_{FD2}$, the line representing the first pixel signal $V_{FD1}$, and the line representing the third pixel signal $V_{FD3}$ are obtained. As illustrated in FIG. 7, in the first embodiment, the three lines of the line representing the second SNR $SN_{FD2}$, the line representing the first SNR $SN_{FD1}$, and the line representing the third SNR $SN_{FD3}$ are obtained.

In contrast, according to the eighth embodiment, a line representing the fifth pixel signal $V_{FD5}$ is further obtained in the region where the light intensity is greater than the line representing the third pixel signal $V_{FD3}$. Additionally, a line representing the SNR related to the fifth pixel signal $V_{FD5}$ is further obtained in the region where the light intensity is greater than line representing the third SNR $SN_{FD3}$. According to the eighth embodiment, a wide dynamic range is easily achieved.

Also, in the eighth embodiment, the capacitance value of the first capacitor Cs3 can be decreased further than the first embodiment, and the decrease can be treated as the capacitance value of the additional capacitor Cs5. This configuration may mitigate the decrease in the seam SNR. Consequently, the light intensity range with a high SNR can be widened.

Ninth Embodiment

Figure 21:
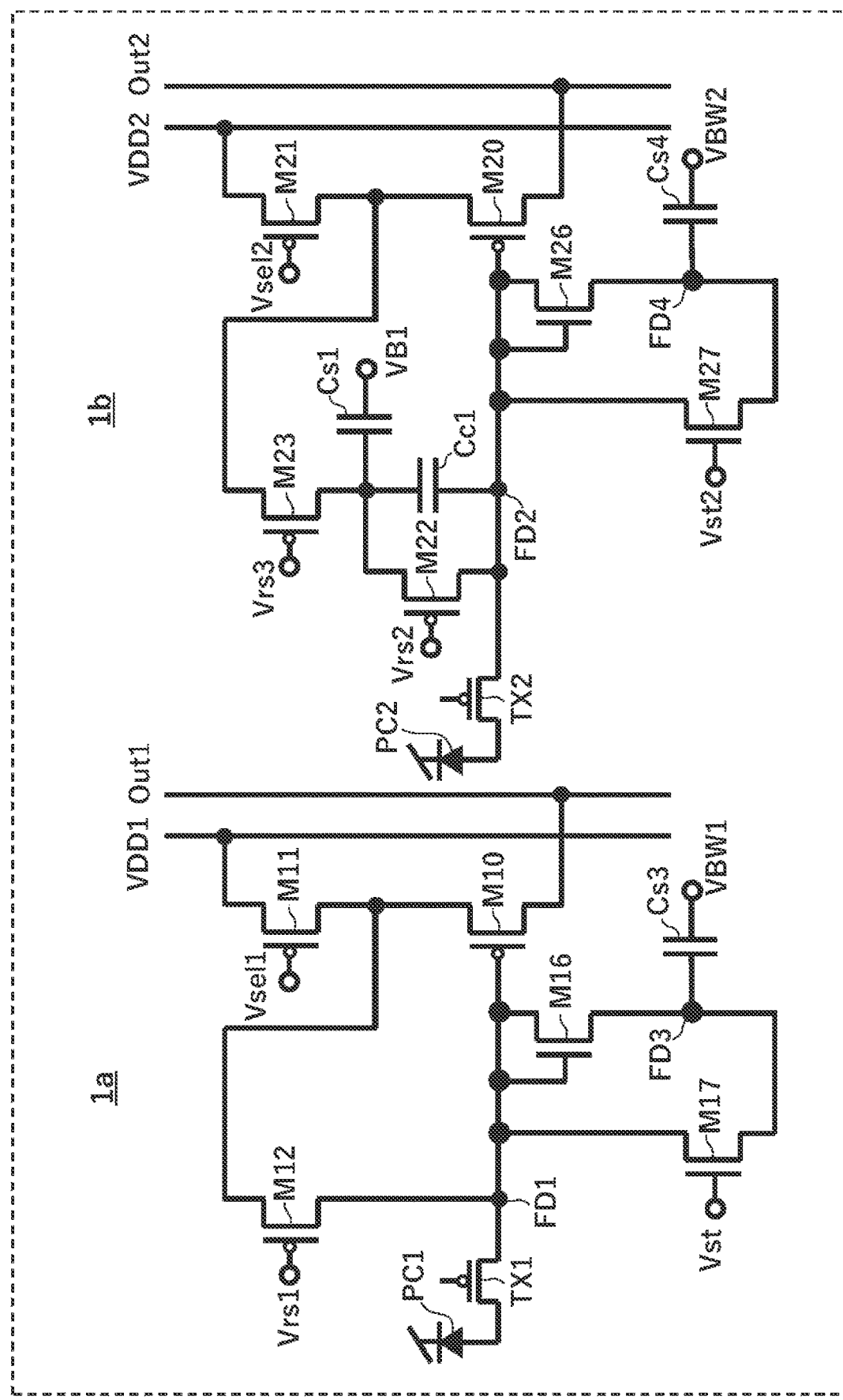
FIG. 21 is a schematic diagram illustrating a circuit configuration of a pixel of an imaging device according to a ninth embodiment.

FIG. 21 illustrates a circuit configuration of a pixel 1 of an imaging device 100 according to a ninth embodiment.

In the ninth embodiment, the first photoelectric converter PC1 is a first photodiode. Also, the imaging device 100 of the ninth embodiment is provided with a first transfer transistor TX1. The first photoelectric converter PC1 is connected to the first charge storage FD1 through the first transfer transistor TX1. The first charge storage FD1 is electrically connected to the first amplification transistor M10.

Specifically, in the ninth embodiment, the first imaging cell 1a is provided with the first transfer transistor TX1. More specifically, the first signal processing circuit P1 is provided with the first transfer transistor TX1.

In the ninth embodiment, the second photoelectric converter PC2 is a second photodiode. Also, the imaging device 100 of the ninth embodiment is provided with a second transfer transistor TX2. The second photoelectric converter PC2 is connected to the second charge storage FD2 through the second transfer transistor TX2. The second charge storage FD2 is electrically connected to the second amplification transistor M20.

Specifically, in the ninth embodiment, the second imaging cell 1b is provided with the second transfer transistor TX2. More specifically, the second signal processing circuit P2 is provided with the second transfer transistor TX2.

In the ninth embodiment, the first photodiode generates a positive charge as the signal charge. Specifically, the signal charge is positive holes.

In the ninth embodiment, the second photodiode generates a positive charge as the signal charge. Specifically, the signal charge is positive holes.

In the ninth embodiment, the transistors M10, M11, M12, TX1, M20, M21, M22, M23, and TX2 are p-type transistors. Specifically, the transistors are p-type MOSFETs. On the other hand, the transistors M16, M17, M26, and M27 are n-type transistors. Specifically, the transistors are n-type MOSFETs.

However, a negative charge may also be used as the signal charge. Specifically, electrons may be used as the signal charge. In this case, n-type transistors can be used as the transistors M10, M11, M12, TX1, M20, M21, M22, M23, and TX2. Specifically, n-type MOSFETs can be used as the transistors. Also, p-type transistors can be used as the transistors M16, M17, M26, and M27. Specifically, p-type MOSFETs can be used as the transistors.

10th Embodiment

Figure 22:
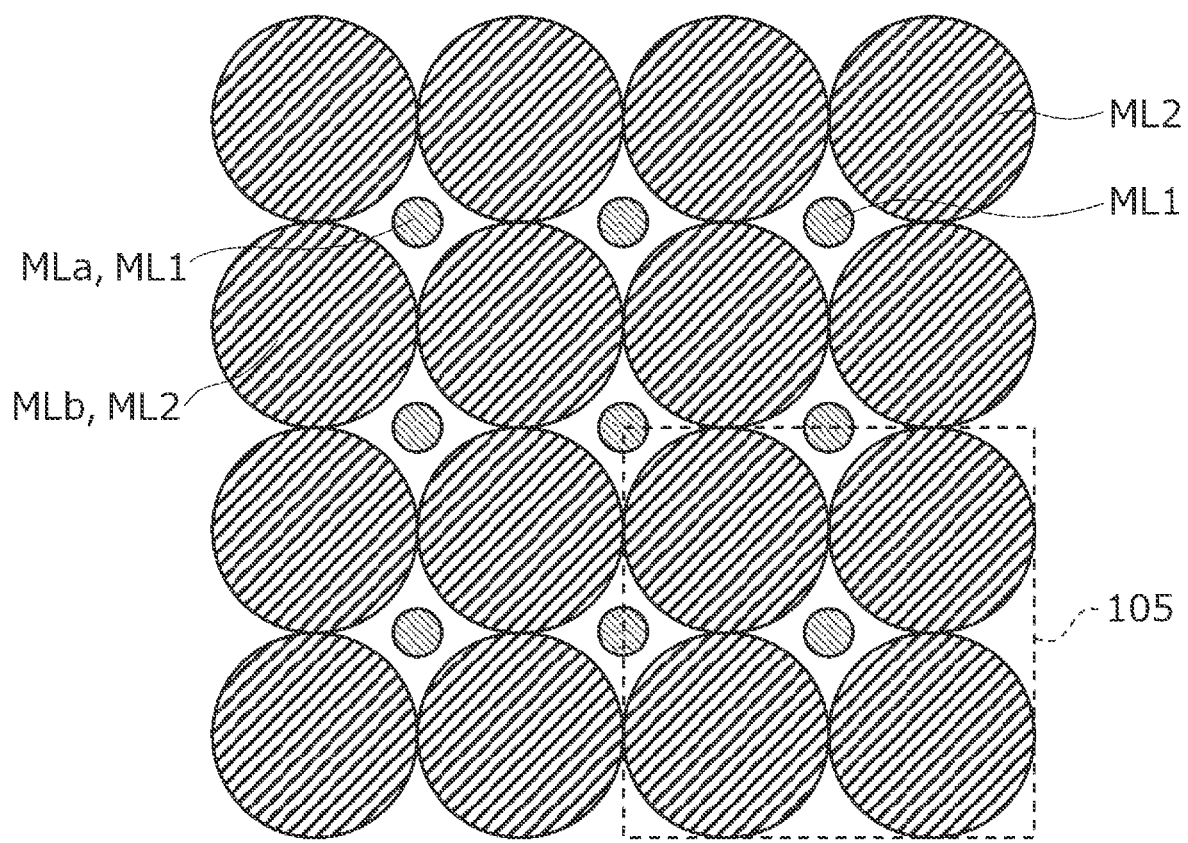
FIG. 22 is a plan view illustrating an arrangement of microlenses according to a 10th embodiment.
Figure 22:
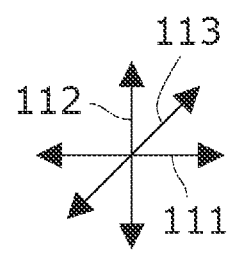

Some or all of the technical features of the 10th embodiment are applicable to the first to ninth embodiments. FIG. 22 is a plan view illustrating an arrangement of microlenses according to the 10th embodiment.

The first imaging cell 1a includes a first microlens ML1. Light is incident on the first photoelectric converter PC1 through the first microlens ML1. The second imaging cell 1b includes a second microlens ML2. Light is incident on the second photoelectric converter PC2 through the second microlens ML2. In a planar view, the area of the second microlens ML2 is larger than the area of the first microlens ML1. According to the above size relationship, the sensitivity of the second imaging cell 1b is easily raised higher than the sensitivity of the first imaging cell 1a.

In a planar view, a ratio S2/S1 is equal to or greater than 16, for example, where S1 is the area of the first microlens ML1 and S2 is the area of the second microlens ML2. The ratio S2/S1 may also be equal to or greater than 36. The ratio S2/S1 is less than or equal to 400, for example. The ratio S2/S1 may also be less than or equal to 100.

Typically, the first microlens ML1 has a convex surface. Light is refracted by the convex surface and concentrated on the first photoelectric converter PC1. The second microlens ML2 has a convex surface. Light is refracted by the convex surface and concentrated on the second photoelectric converter PC2.

In the present embodiment, the first microlens ML1 has a circular shape in a planar view. However, the first microlens ML1 may also have another shape in a planar view, such as an elliptical shape.

In the present embodiment, the second microlens ML2 has a circular shape in a planar view. However, the second microlens ML2 may also have another shape in a planar view, such as an elliptical shape.

The imaging device according to the present embodiment is provided with multiple pixels 1. Consequently, the imaging device according to the present embodiment is provided with multiple first microlenses ML1, multiple second microlenses ML2, multiple first photoelectric converters PC1, multiple second photoelectric converters PC2, multiple first photoelectric conversion layers D1, multiple second photoelectric conversion layers D2, multiple first upper electrodes E1a, multiple second upper electrodes E2a, multiple first pixel electrodes E1b, and multiple second pixel electrodes E2b.

In the present embodiment, the first microlenses ML1 and the second microlenses ML2 form a series of lens groups. The series of lens groups has multiple convex surfaces. Each convex surface belongs to the first microlenses ML1 or the second microlenses ML2.

In the present embodiment, the first photoelectric conversion layers D1 and the second photoelectric conversion layers D2 form a series of layers. However, the individual photoelectric conversion layers D1 or D2 may also be separate from one another.

In the present embodiment, the first upper electrodes E1a and the second upper electrodes E2a form a series of electrodes. However, the individual upper electrodes E1a or E2a may also be separate from one another.

Hereinafter, a single pixel electrode E1b or E2b is referred to as a unit pixel electrode. The unit pixel electrodes are separate from one another. Shield electrodes are arranged between adjacent unit pixel electrodes. The shield electrodes collect the signal charge generated by photoelectric conversion in the photoelectric conversion layers D1 or D2. In this way, the shield electrodes may keep noise from being mixed into the charge storage FD1 or FD2.

As illustrated in FIG. 22, in the present embodiment, the first microlenses ML1 are arrayed along a first axis 111 and a second axis 112. The second microlenses ML2 are arrayed along the first axis 111 and the second axis 112. In a planar view, each first microlens ML1 is disposed in the gap between four adjacent second microlenses ML2. The dashed-line frame 105 in FIG. 22 encloses four adjacent second microlenses ML2. The second axis 112 is orthogonal to the first axis 111.

In the present embodiment, in a single pixel 1, the first microlens ML1 and the second microlens ML2 are aligned along a third axis 113 different from the first axis 111 and the second axis 112 in a planar view. In FIG. 22, the signs MLa and MLb respectively denote the first microlens ML1 and the second microlens ML2 that belong to the same pixel 1.

According to the present embodiment, the relatively small first microlenses ML1 and the relatively large second microlenses ML2 can be arrayed efficiently in a planar view.

11th Embodiment

Figure 23:
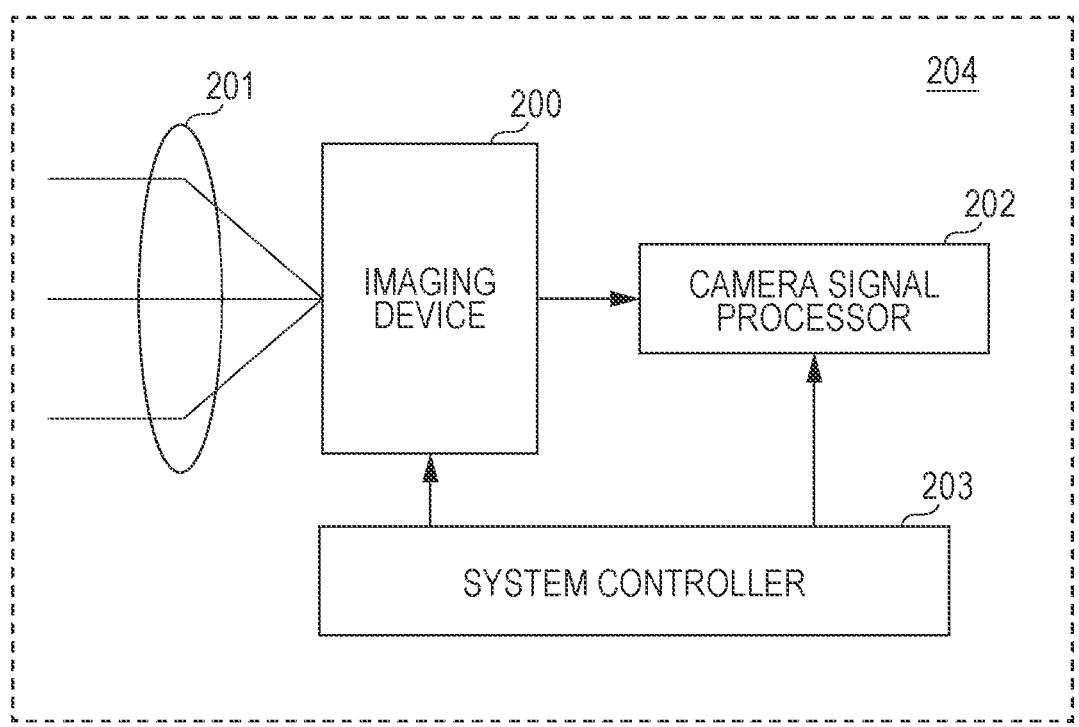
FIG. 23 is a schematic diagram illustrating a system configuration of an imaging system according to an 11th embodiment.

FIG. 23 will be referenced to describe an imaging system 204 according to the 11th embodiment.

FIG. 23 illustrates a system configuration of the imaging system 204 according to the present embodiment. The imaging system 204 is provided with lens optics 201, an imaging device 200, a system controller 203, and a camera signal processor 202. In the present embodiment, the imaging system 204 is a camera system.

The lens optics 201 include an autofocus lens, a zoom lens, and a diaphragm, for example. The lens optics 201 condenses light onto the imaging surface of the imaging device 200.

The imaging device 100 described in the first to 10th embodiments can be used as the imaging device 200.

The system controller 203 controls the imaging system 204 as a whole. The system controller 203 may be achieved by a microcomputer, for example.

The camera signal processor 202 functions as a signal processing circuit that processes output signals from the imaging device 200. The camera signal processor 202 performs processing such as gamma correction, color interpolation processing, spatial interpolation processing, and auto white balance, for example. The camera signal processor 202 may be achieved by a digital signal processor (DSP), for example.

The camera signal processor 202 can acquire captured image data from the imaging device 200 and perform sensing on the captured image data. For example, the camera signal processor 202 can calculate the distance to a following vehicle through sensing. As described above, the camera signal processor 202 may also detect a specific subject in the acquired captured image data and initiate sensing in response to the detection.

The imaging system 204 is provided with a program that defines software for combining pixel signals corresponding to the creation of the "single line" described above. Specifically, the camera signal processor 202 is provided with the program. With regard to the combining of pixel signals, see the above description referencing FIGS. 6 and 7.

As the above description demonstrates, the imaging system 204 is provided with the imaging device 200 and the program. The program defines software. The software creates a combined signal that varies depending on changes in the intensity of the light incident on the imaging device 200, on the basis of a pixel signal originating from the first charge storage FD1 and a pixel signal originating from the first capacitor Cs3. Specifically, the software creates a combined signal that varies depending on changes in the intensity of the light incident on the imaging device 200, on the basis of a pixel signal originating from the second charge storage FD2, a pixel signal originating from the first charge storage FD1, and a pixel signal originating from the first capacitor Cs3. The pixel signal originating from the second charge storage FD2 is the second pixel signal $V_{FD2}$ in the preceding embodiments. The pixel signal originating from the first charge storage FD1 is the first pixel signal $V_{FD1}$. The pixel signal originating from the first capacitor Cs3 is the third pixel signal $V_{FD3}$.

In the imaging system 204, the program defining the software may be stored in a computer-readable recording medium. The computer-readable recording medium may be random access memory (RAM), read-only memory (ROM), a disk drive, a solid-state drive (SSD), or flash memory, for example.

The technology according to the present disclosure makes it possible to acquire optimal sensing data. Moreover, an imaging system that may achieve low power consumption for the system as a whole may be provided.

Various modifications can be applied in relation to the technology according to the present disclosure.

For example, the first capacitor Cs3 of the first imaging cell 1a in the fourth embodiment illustrated in FIG. 16 may be omitted. In this case, the specific capacitor Cs1 can be thought of as forming the first capacitor. The same is also true of the fifth embodiment illustrated in FIG. 17.

The configuration of the second imaging cell 1b of the sixth embodiment illustrated in FIG. 18 may be applied to the first imaging cell 1a.

In the embodiments described above, the first interposing transistor M16, the first capacitor Cs3, and the first following transistor M17 belong to the first imaging cell 1a. However, the above elements may also belong to the second imaging cell 1b. Moreover, the above elements may also be disposed outside the first imaging cell 1a and the second imaging cell 1b. The same is also true of the additional amplification transistor M30 and the additional select transistor M31 according to the second embodiment illustrated in FIG. 13. The same is also true of the additional capacitor Cs5, the additional interposing transistor M36, and the additional following transistor M37 according to the eighth embodiment illustrated in FIG. 20.

In the sixth embodiment illustrated in FIG. 18, the second capacitor Cs4, the second interposing transistor M26, and the second following transistor M27 belong to the second imaging cell 1b. However, the above elements may also belong to the first imaging cell 1a. Moreover, the above elements may also be disposed outside the first imaging cell 1a and the second imaging cell 1b. The same is also true of the seventh embodiment illustrated in FIG. 19.

In the eighth embodiment illustrated in FIG. 20, the first charge storage FD1 is the destination of the electrical connection from the other of the source or drain of the first following transistor M17. However, like the third embodiment illustrated in FIG. 15, the second charge storage FD2 may be treated as the destination of the electrical connection. Like the fourth embodiment illustrated in FIG. 16, the second charge storage FD2 may also be treated as the destination of the electrical connection while using the second reset transistor M22 as the first following transistor M17. Like the fifth embodiment illustrated in FIG. 17, the first charge storage FD1 may also be treated as the destination of the electrical connection while using the first reset transistor M12 as the first following transistor M17. The additional capacitor Cs5, the additional interposing transistor M36, and the additional following transistor M37 in the eighth embodiment illustrated in FIG. 20 may also be applied to the sixth embodiment illustrated in FIG. 18, to the seventh embodiment illustrated in FIG. 19, or to the ninth embodiment illustrated in FIG. 21.

In the ninth embodiment illustrated in FIG. 21, the first photoelectric converter PC1 and the second photoelectric converter PC2 are both photodiodes. However, the first photoelectric converter PC1 may include the first photoelectric conversion layer D1 and the pair of electrodes E1a and E1b, and the second photoelectric converter PC2 may be a photodiode. Also, the first photoelectric converter PC1 may be a photodiode, and the second photoelectric converter PC2 may include the second photoelectric conversion layer D2 and the pair of electrodes E2a and E2b.

In the imaging device 100 or 200 of the embodiments described above, the first imaging cell 1a and the second imaging cell 1b are included inside a single pixel 1. In the imaging device 100 or 200 of the embodiments described above, the 1-pixel, 2-cell method is adopted, in which two imaging cells are included inside a single pixel 1. However, another imaging cell in addition to the imaging cells 1a and 1b may also be included inside a single pixel 1. Alternatively, only one of the first imaging cell 1a or the second imaging cell 1b may be included inside a single pixel 1. In other words, a 1-pixel, 1-cell method may be adopted, in which one imaging cell is included inside a single pixel 1. The technology according to the present disclosure is also applicable to an imaging device adopting the 1-pixel, 1-cell method. A wide dynamic range is also achievable with the 1-pixel, 1-cell method.

In a first example of the 1-pixel, 1-cell method, an imaging cell similar to the second imaging cell 1b illustrated on the right side of FIG. 18 is included inside a single pixel 1. According to the first example, noise canceling is possible. In a second example of the 1-pixel, 1-cell method, an imaging cell similar to the first imaging cell 1a illustrated on the left side of FIG. 18 is included inside a single pixel 1. The second example, although incapable of noise canceling, is simple. The 1-pixel, 1-cell method may also be adopted by using an imaging cell similar to the first imaging cell 1a or the second imaging cell 1b in another drawing.

Figure 24:
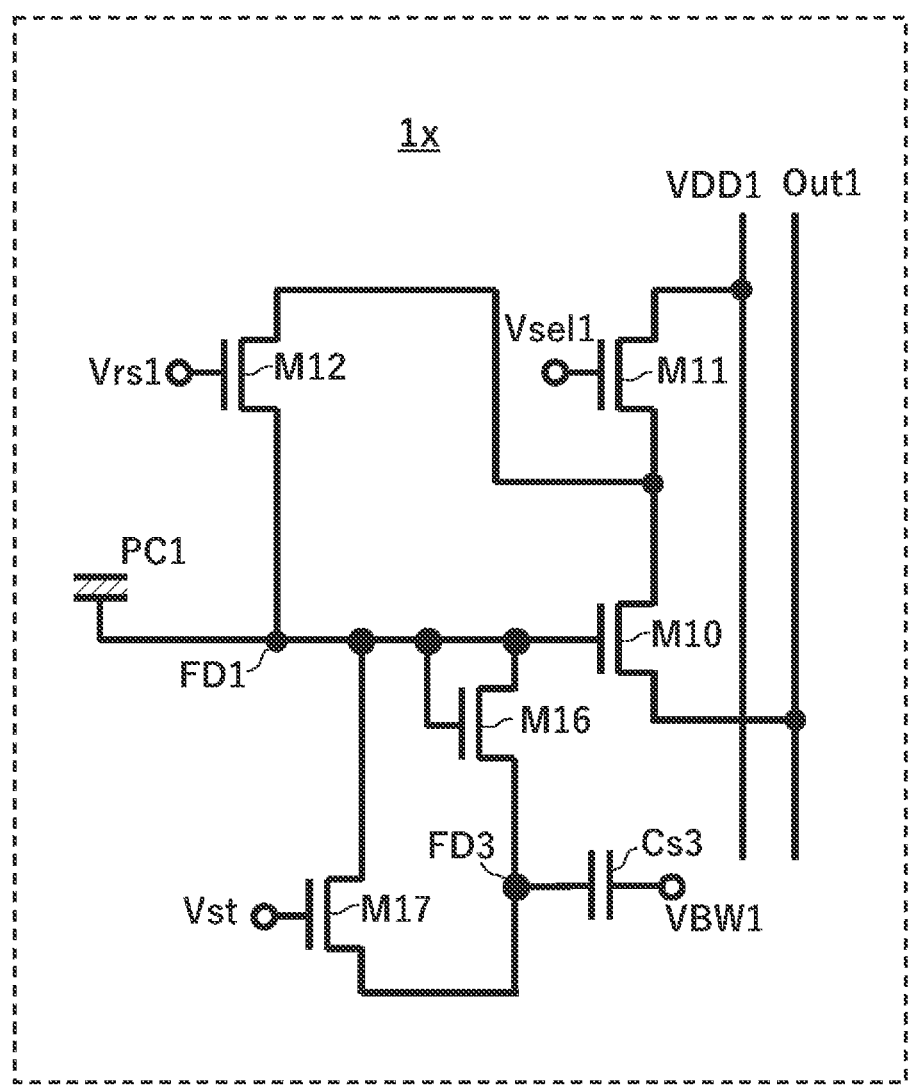
FIG. 24 is a schematic diagram illustrating a circuit configuration of a pixel of the 1-pixel, 1-cell method according to an example.

FIG. 24 is a schematic diagram illustrating a circuit configuration of a pixel of the 1-pixel, 1-cell method according to an example. Specifically, the pixel in FIG. 24 includes an imaging cell 1x similar to the first imaging cell 1a in FIG. 3. As described above, a pixel of the 1-pixel, 1-cell method may also include an imaging cell similar to the first imaging cell 1a or the second imaging cell 1b in another drawing.

In each of the embodiments, elements may be added or removed, as appropriate. For example, an element such as a transistor may be added between the first interposing transistor M16 and the first capacitor Cs3. "By turning on the first interposing transistor M16, the first charge storage FD1 and the first capacitor Cs3 are electrically connected" encompasses a configuration containing the above addition.

The imaging device according to the present disclosure is usable in any of various types of camera systems and sensor systems, such as a digital still camera, a medical camera, a monitoring camera, an in-vehicle camera, a digital single-lens reflex (DSLR) camera, or a digital mirrorless single-lens camera.

What is claimed is:

1. An imaging device comprising:
   a first photoelectric converter that converts light into a charge;
   a first charge storage that stores the charge;
   a first capacitor;
   an output circuit electrically connected to the first capacitor; and
   a first transistor including a gate electrode, a source, and a drain, the gate electrode and one of the source or the drain being connected to the first charge storage without interposing a switching element, wherein by turning on the first transistor, the first charge storage and the first capacitor are electrically connected.

2. The imaging device according to claim 1, further comprising:
a second transistor, wherein
by turning on the second transistor, the output circuit is electrically connected to the first capacitor.

3. The imaging device according to claim 1, wherein the first photoelectric converter includes a first electrode, a second electrode, and a photoelectric conversion layer disposed between the first electrode and the second electrode.

4. The imaging device according to claim 1, wherein the first photoelectric converter is a photodiode.

5. The imaging device according to claim 1, wherein the first capacitor has a metal-insulator-metal structure.

6. The imaging device according to claim 1, wherein
by turning on the first transistor, the first charge storage is electrically connected to one end of the first capacitor, and
a direct-current potential is applied to another end of the first capacitor.

7. The imaging device according to claim 1, wherein
the imaging device is configured to take a first state and a second state,
the first state is a state in which the first charge storage and the first capacitor are electrically connected through the first transistor, and
the second state is a state in which a capacitor electrically connected to the first charge storage is not present.

8. The imaging device according to claim 1, wherein a conductivity type of the gate electrode of the first transistor is the opposite of a conductivity type of the source and the drain of the first transistor.

9. The imaging device according to claim 1, wherein the imaging device is configured such that a signal corresponding to a potential of the first charge storage is read out after a signal corresponding to a potential of the first capacitor is read out.

10. The imaging device according to claim 1, further comprising:
an additional capacitor; and
a third transistor including a gate electrode, a source, and a drain, wherein:
the gate electrode of the third transistor and one of the source or the drain of the third transistor are electrically connected to the first capacitor, and
by turning on the third transistor, the first capacitor and the additional capacitor are electrically connected.

11. The imaging device according to claim 1, further comprising:
a second transistor including a gate electrode, a source, and a drain; and
a fourth transistor including a gate electrode, a source, and a drain, wherein:
the first charge storage is electrically connected to the gate electrode of the fourth transistor, and
by turning on the second transistor, the first capacitor, one of the source or the drain of the second transistor, the other of the source or the drain of the second transistor, and the gate electrode of the fourth transistor are electrically connected in the above order.

12. The imaging device according to claim 11, further comprising:
a first imaging cell; and
a second imaging cell including a second photoelectric converter and a second charge storage, wherein
the first imaging cell and the second imaging cell are included inside a single pixel included in the imaging device,
the first imaging cell includes the first photoelectric converter and the first charge storage, and
the second charge storage stores a charge generated by the second photoelectric converter.

13. The imaging device according to claim 12, wherein:
the second imaging cell further includes a second capacitor and a seventh transistor including a gate electrode, a source, and a drain,
the gate electrode of the seventh transistor and one of the source or the drain of the seventh transistor are electrically connected to the second charge storage, and
by turning on the seventh transistor, the second charge storage and the second capacitor are electrically connected.

14. The imaging device according to claim 1, further comprising:
a fourth transistor including a gate electrode, a source, and a drain; and
a fifth transistor including a gate electrode, a source, and a drain, wherein:
the first charge storage is electrically connected to the gate electrode of the fourth transistor, and
the first capacitor is electrically connected to the gate electrode of the fifth transistor.

15. The imaging device according to claim 1, further comprising:
a first imaging cell; and
a second imaging cell including a second photoelectric converter and a second charge storage, wherein
the first imaging cell and the second imaging cell are included inside a single pixel included in the imaging device,
the first imaging cell includes the first photoelectric converter and the first charge storage, and
the second charge storage stores a charge generated by the second photoelectric converter.

16. The imaging device according to claim 15, further comprising:
a second transistor including a gate electrode, a source, and a drain, wherein;
the first imaging cell further includes a fourth transistor including a gate electrode, a source, and a drain,
the second imaging cell further includes a sixth transistor including a gate electrode, a source, and a drain,
the first charge storage is electrically connected to the gate electrode of the fourth transistor,
the second charge storage is electrically connected to the gate electrode of the sixth transistor, and
by turning on the second transistor, the first capacitor, one of the source or the drain of the second transistor, the other of the source or the drain of the second transistor, and the gate electrode of the sixth transistor are electrically connected in the above order.

17. The imaging device according to claim 15, further comprising:
a second transistor including a gate electrode, a source, and a drain, wherein:
the first imaging cell further includes a fourth transistor including a gate electrode, a source, and a drain,
the second imaging cell further includes a specific capacitor, the first capacitor is electrically connected to the specific capacitor, the first charge storage is electrically connected to the gate electrode of the fourth transistor, and by turning on the second transistor, the first capacitor, one of the source or the drain of the second transistor, the other of the source or the drain of the second transistor, and the gate electrode of the fourth transistor are electrically connected in the above order.

18. An imaging device comprising:

a first photoelectric converter that converts light into a charge;

a first charge storage that stores the charge;

a first capacitor;

an output circuit electrically connected to the first capacitor; and a first transistor including a gate electrode, a source, and a drain, the gate electrode and one of the source or the drain being connected to the first charge storage without interposing a switching element, wherein the other of the source or the drain is electrically connected to the first capacitor.

19. An imaging device comprising:

a photoelectric converter that converts light into a charge;

a charge storage that stores the charge;

a transistor including a gate electrode, a source and a drain, the gate electrode and one of the source or the drain being connected to the charge storage without interposing a switching element; and a capacitor including a first terminal and a second terminal, the first terminal being connected to the other of the source or the drain without interposing a switching element.

20. The imaging device according to claim 19, further comprising an output circuit configured to output a signal corresponding to a potential of the first terminal.

* * * * *